US008946005B2

(12) United States Patent
Lee et al.

(10) Patent No.: US 8,946,005 B2
(45) Date of Patent: Feb. 3, 2015

(54) THIN-FILM TRANSISTOR, ARRAY SUBSTRATE HAVING THE THIN-FILM TRANSISTOR AND METHOD OF MANUFACTURING THE ARRAY SUBSTRATE

(75) Inventors: Je-Hun Lee, Seoul (KR); Do-Hyun Kim, Seoul (KR); Eun-Guk Lee, Yongin-si (KR); Chang-Oh Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/030,213

(22) Filed: Feb. 18, 2011

(65) Prior Publication Data

US 2011/0140103 A1      Jun. 16, 2011

Related U.S. Application Data

(62) Division of application No. 11/930,502, filed on Oct. 31, 2007, now Pat. No. 7,915,650.

(30) Foreign Application Priority Data

Jun. 14, 2007   (KR) .................................. 2007-58353

(51) Int. Cl.
*H01L 21/00*       (2006.01)
*H01L 21/84*       (2006.01)
(Continued)

(52) U.S. Cl.
CPC ........ *H01L 29/7869* (2013.01); *H01L 27/1214* (2013.01); *H01L 27/1225* (2013.01)
USPC .................. 438/149; 257/59; 257/66; 257/72; 257/E21.46; 257/E21.704; 257/E29.296; 438/161; 438/158; 438/30; 438/199; 438/493; 349/44; 349/46; 349/47; 349/110; 349/111

(58) Field of Classification Search
USPC .................. 257/59, 66, 72, E21.46, E21.704, 257/E29.296; 438/161, 158, 30, 149, 199, 438/493; 349/110, 44, 46, 47, 111
See application file for complete search history.

(56) References Cited

U.S. PATENT DOCUMENTS

| 6,243,146 B1 | 6/2001 | Rho et al. | |
|---|---|---|---|
| 2003/0052272 A1* | 3/2003 | Kiuchi et al. | ............ 250/339.12 |

(Continued)

FOREIGN PATENT DOCUMENTS

| CN | 1941299 A | 4/2007 |
|---|---|---|
| CN | 1950951 A | 4/2007 |

(Continued)

*Primary Examiner* — Meiya Li
(74) *Attorney, Agent, or Firm* — Cantor Colburn LLP

(57) ABSTRACT

A thin-film transistor includes a semiconductor pattern, source and drain electrodes and a gate electrode, the semiconductor pattern is formed on a base substrate, and the semiconductor pattern includes metal oxide. The source and drain electrodes are formed on the semiconductor pattern such that the source and drain electrodes are spaced apart from each other and an outline of the source and drain electrodes is substantially same as an outline of the semiconductor pattern. The gate electrode is disposed in a region between the source and drain electrodes such that portions of the gate electrode are overlapped with the source and drain electrodes. Therefore, leakage current induced by light is minimized. As a result, characteristics of the thin-film transistor are enhanced, after-image is reduced to enhance display quality, and stability of manufacturing process is enhanced.

9 Claims, 36 Drawing Sheets

(51) Int. Cl.
*H01L 29/786* (2006.01)
*H01L 27/12* (2006.01)

(56) References Cited

U.S. PATENT DOCUMENTS

| | | | |
|---|---|---|---|
| 2004/0180480 A1 * | 9/2004 | Dejima | 438/161 |
| 2005/0095759 A1 | 5/2005 | Cho et al. | |
| 2006/0231858 A1 | 10/2006 | Akimoto et al. | |
| 2006/0286737 A1 * | 12/2006 | Levy et al. | 438/199 |
| 2007/0001172 A1 * | 1/2007 | Yu et al. | 257/66 |
| 2007/0184576 A1 | 8/2007 | Chang et al. | |

FOREIGN PATENT DOCUMENTS

| | | |
|---|---|---|
| JP | 2004-103957 A | 4/2004 |
| JP | 2006317926 A | 11/2006 |
| KR | 1020060001425 A | 1/2006 |
| KR | 1020070019377 A | 2/2007 |
| KR | 1020070035373 A | 3/2007 |
| WO | WO 2007063966 A1 * | 6/2007 |

* cited by examiner

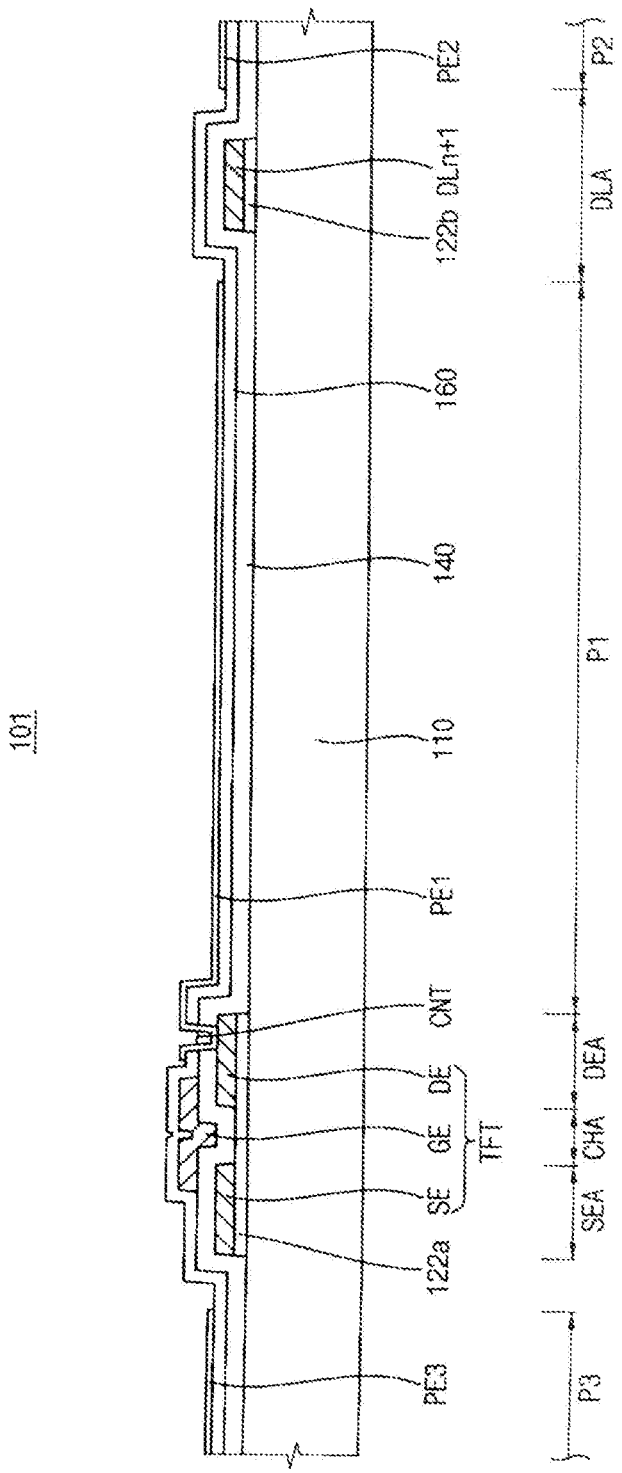

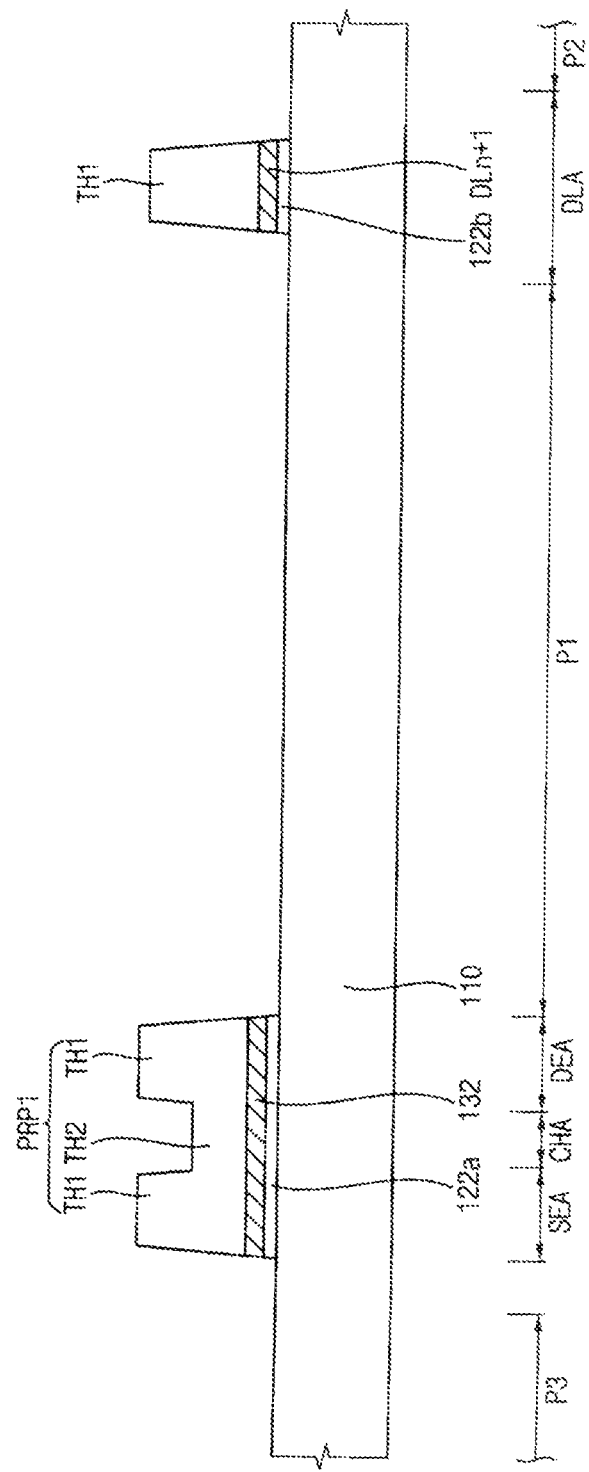

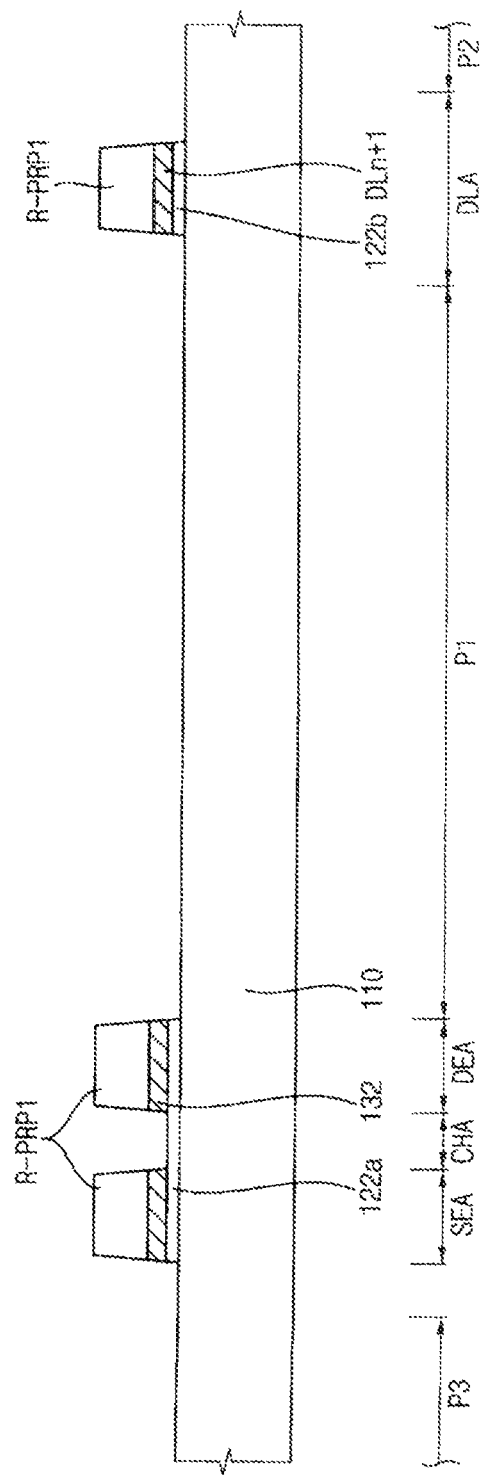

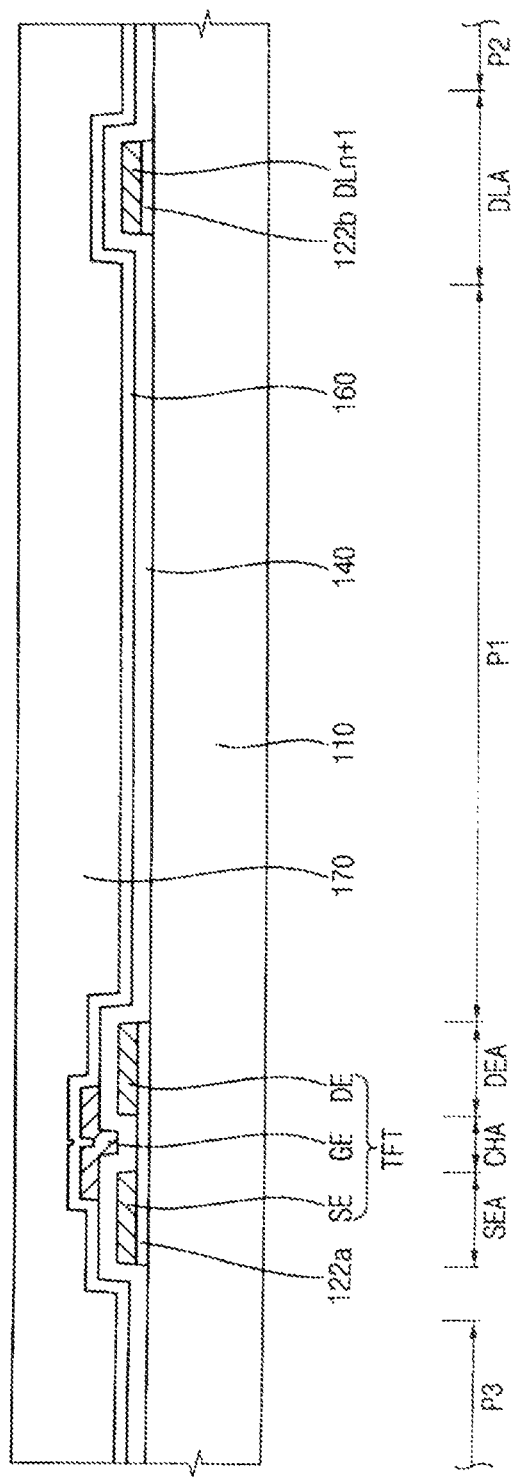

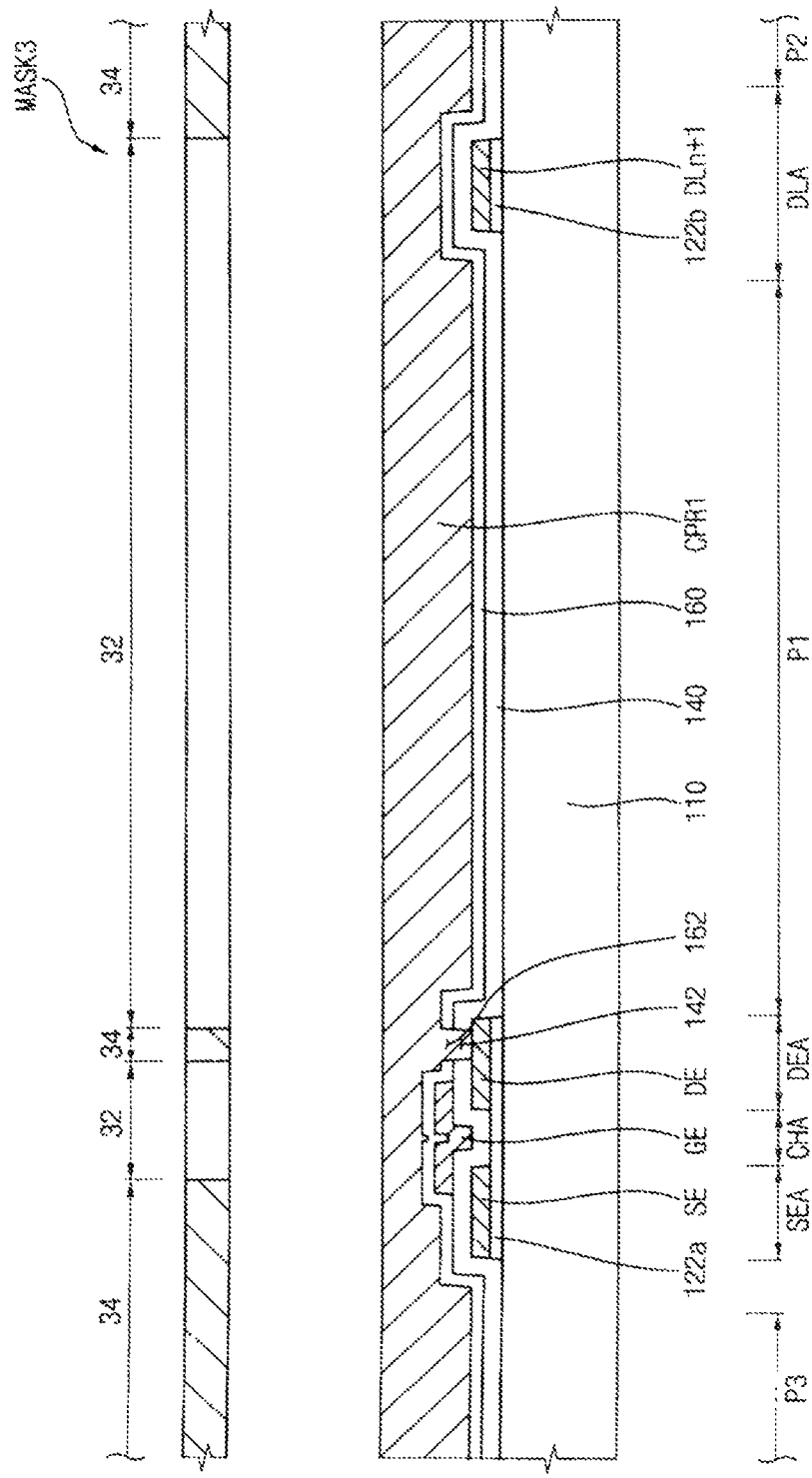

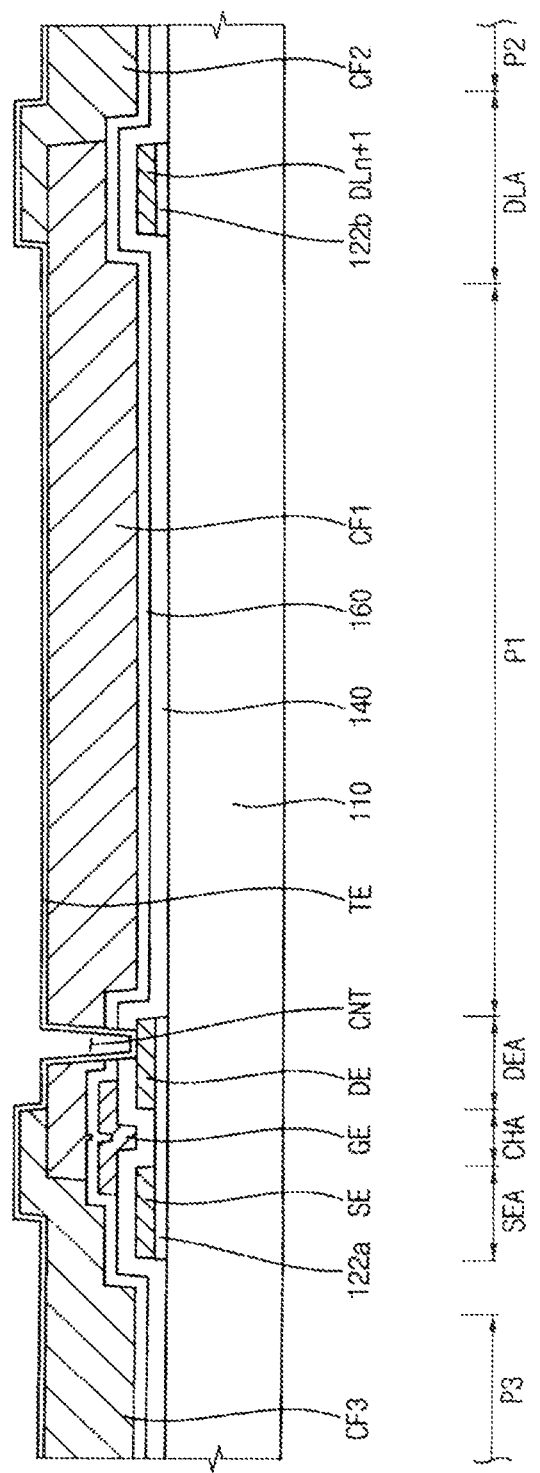

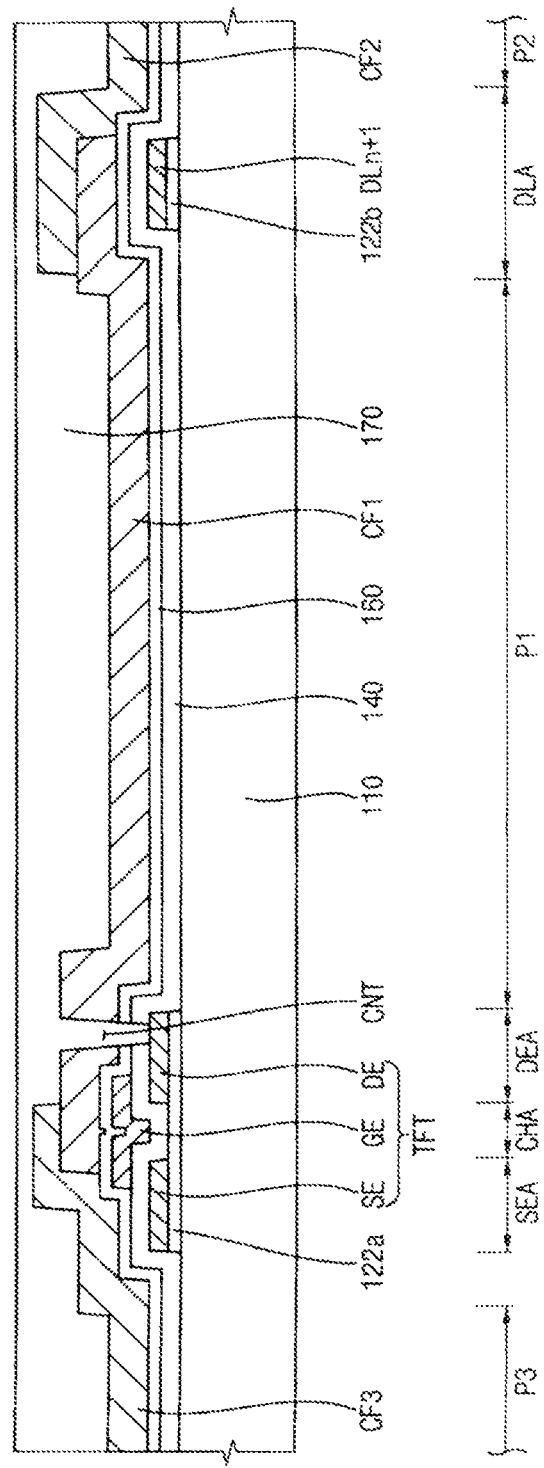

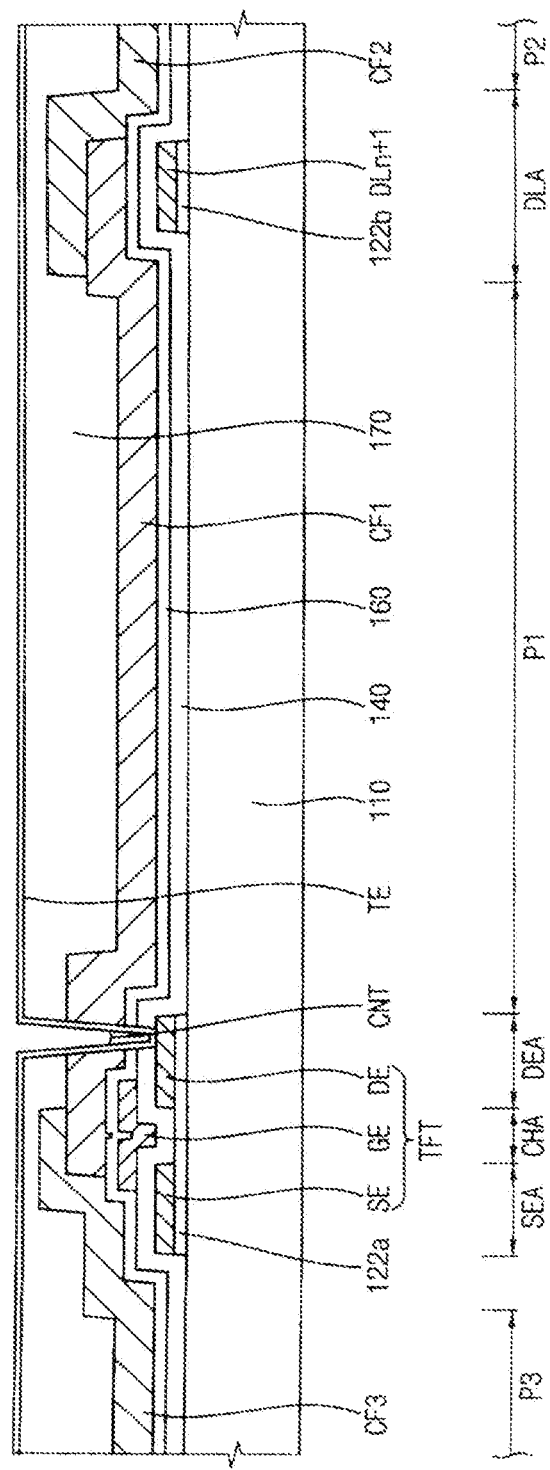

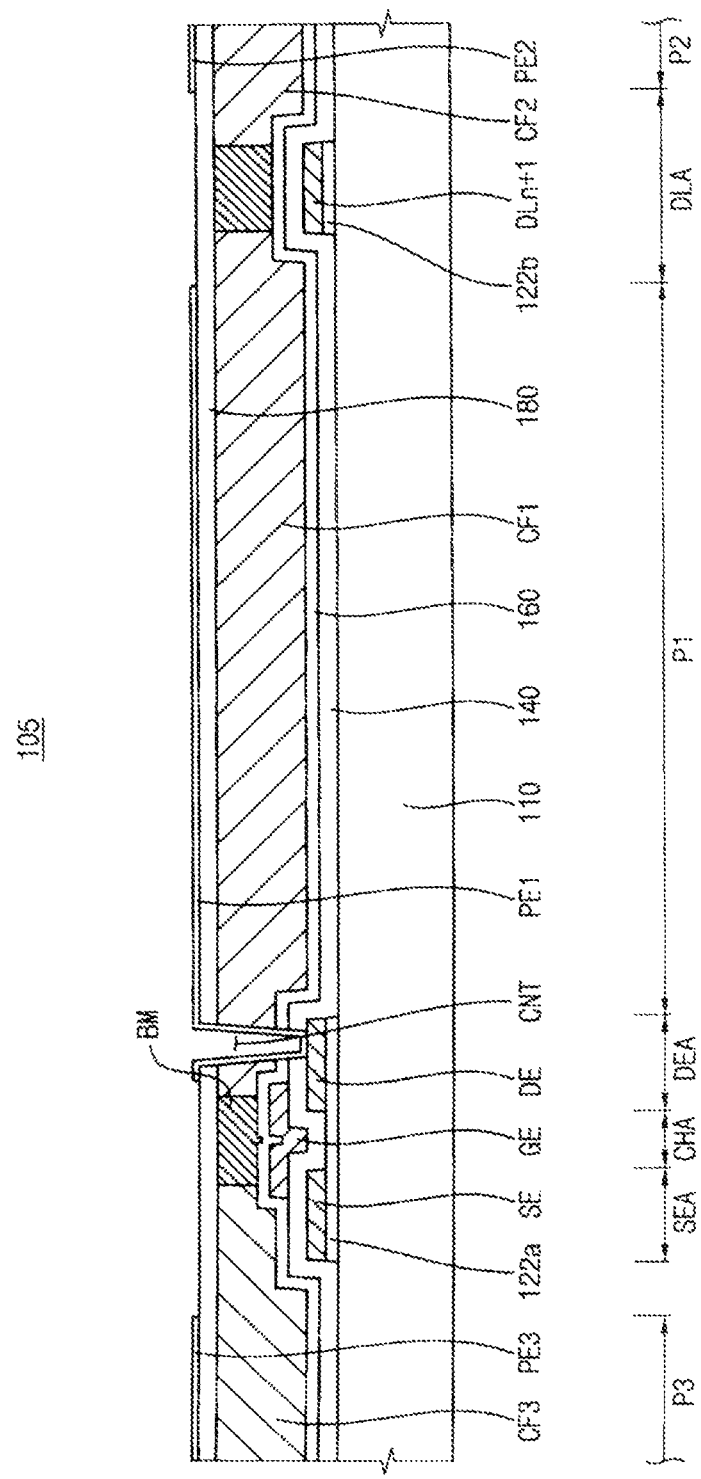

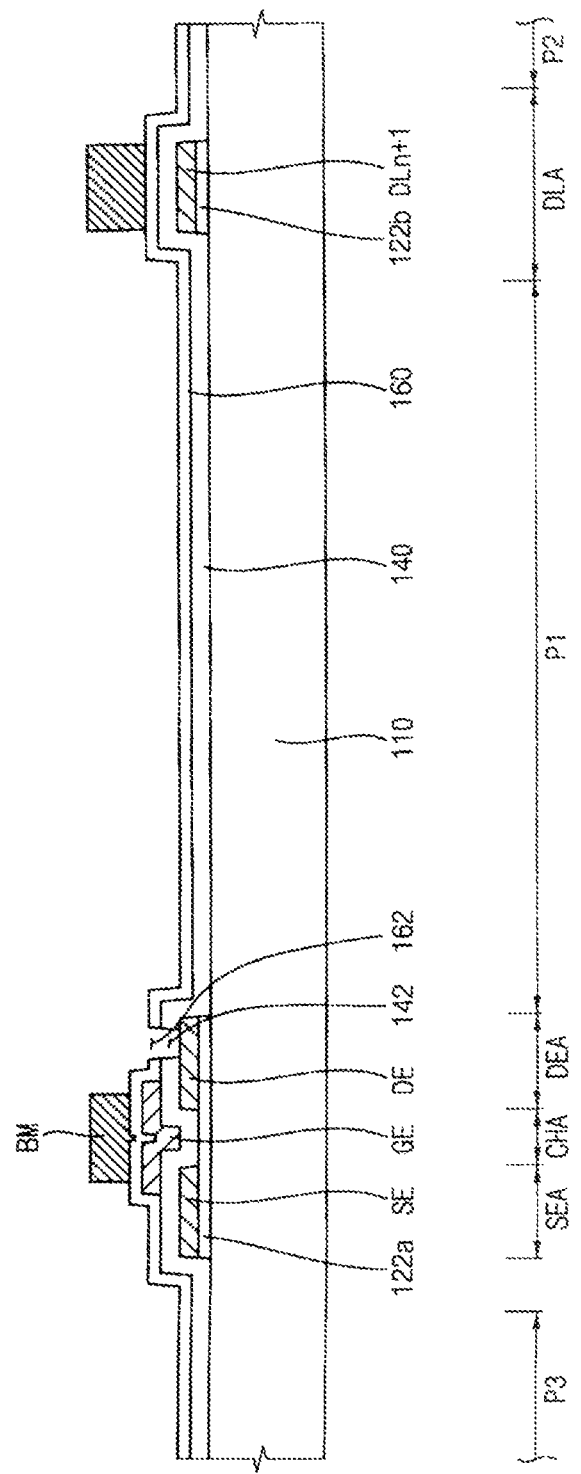

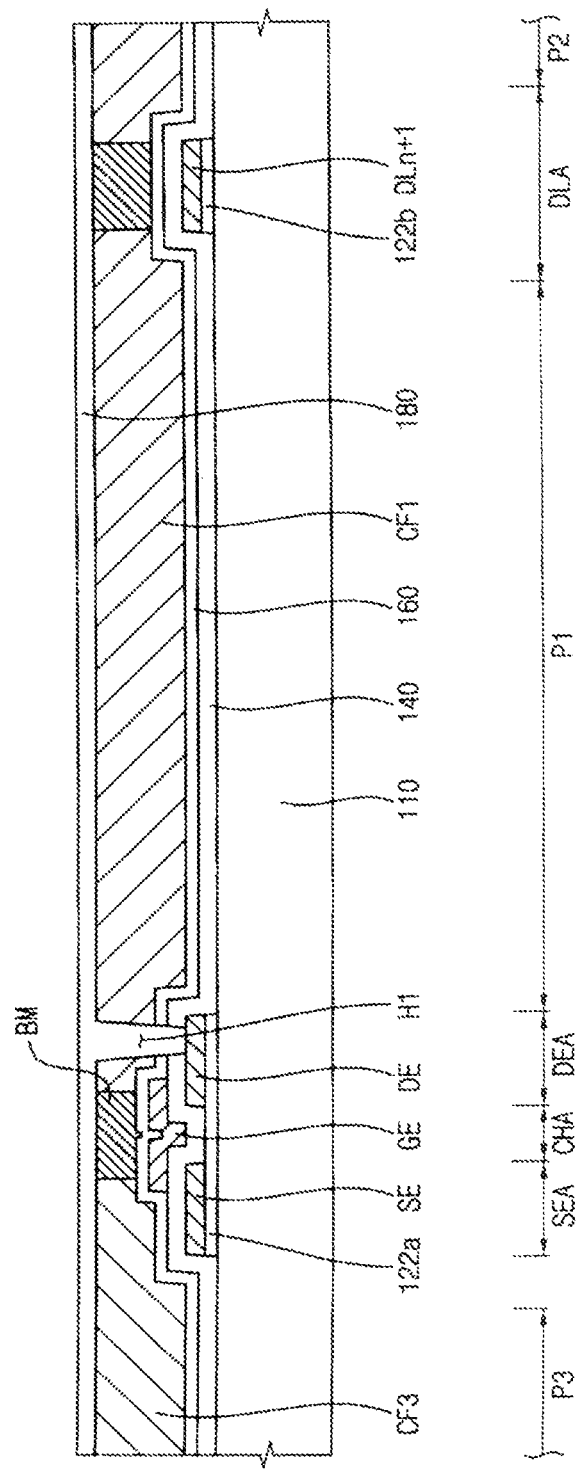

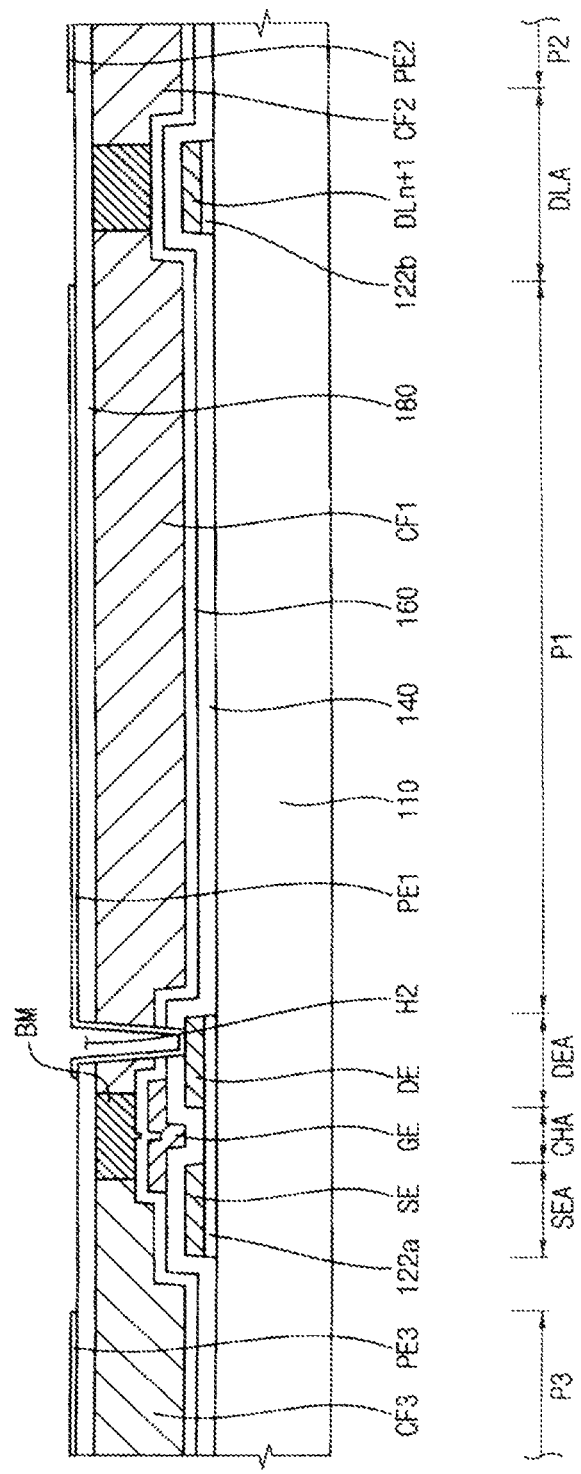

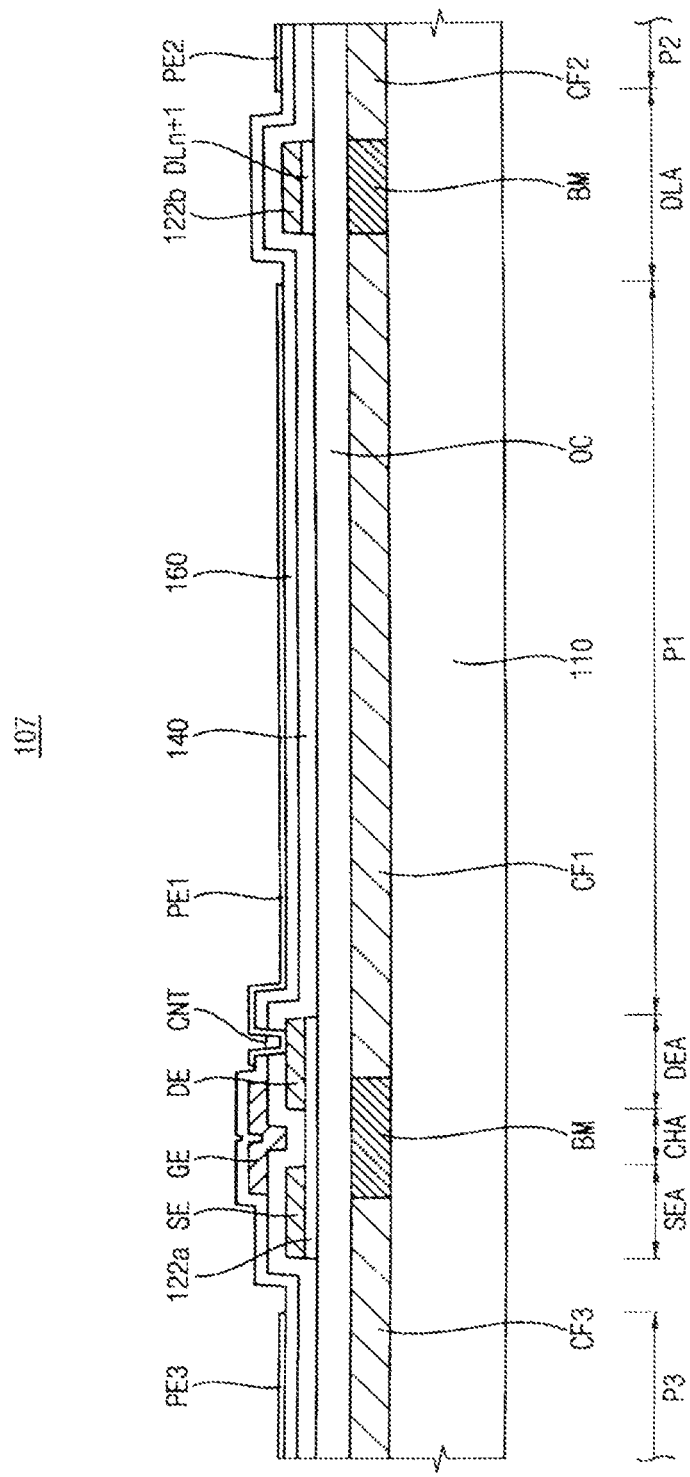

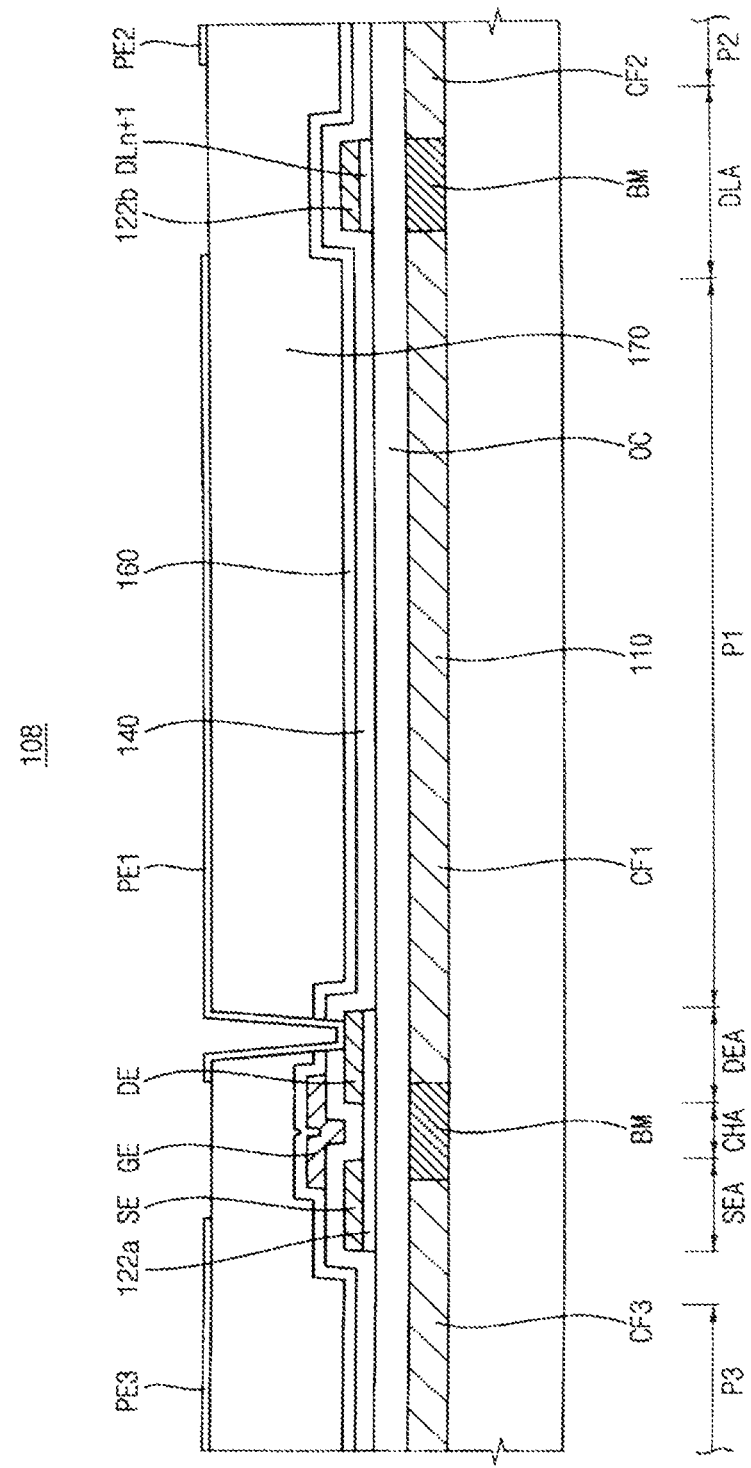

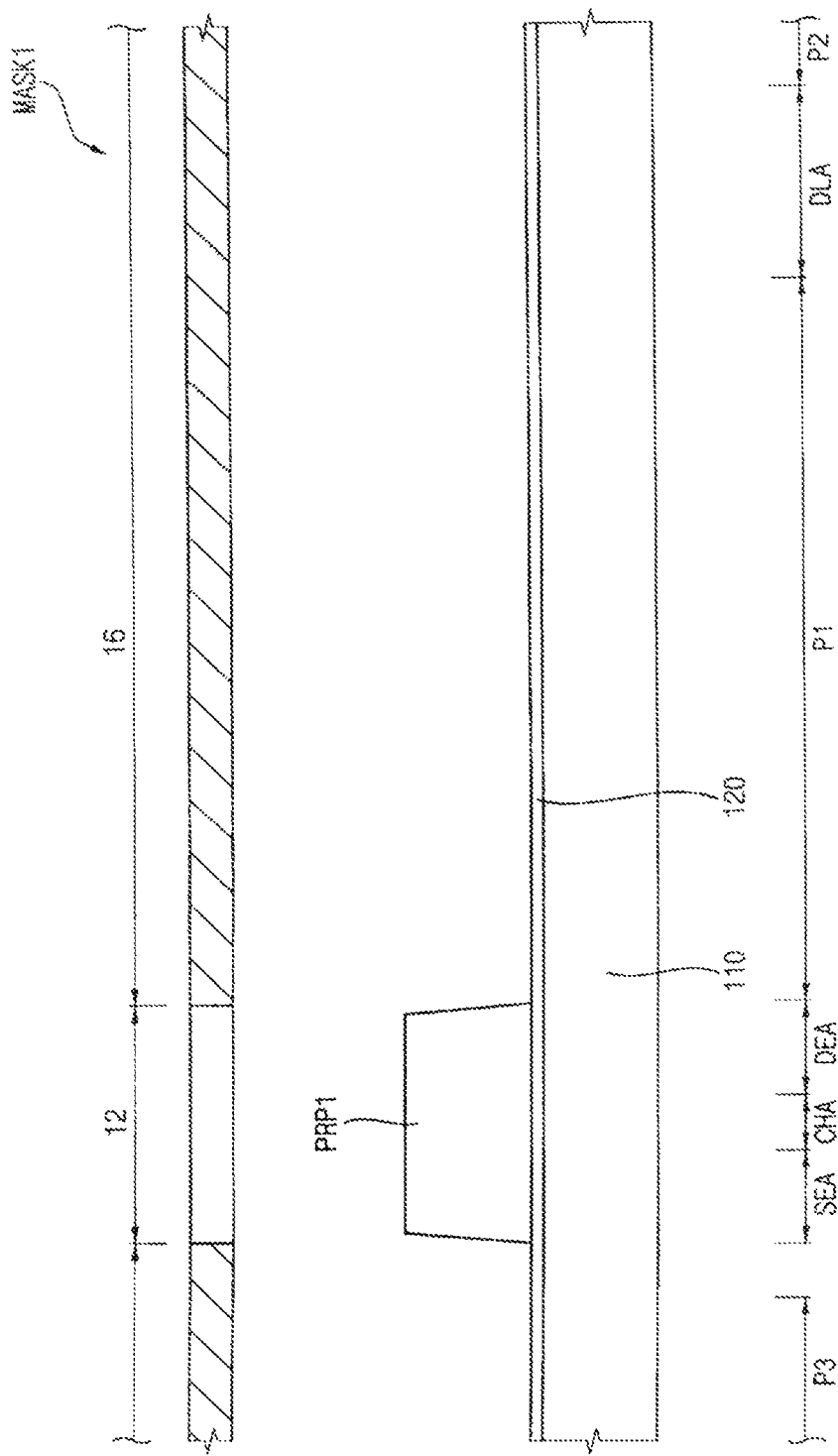

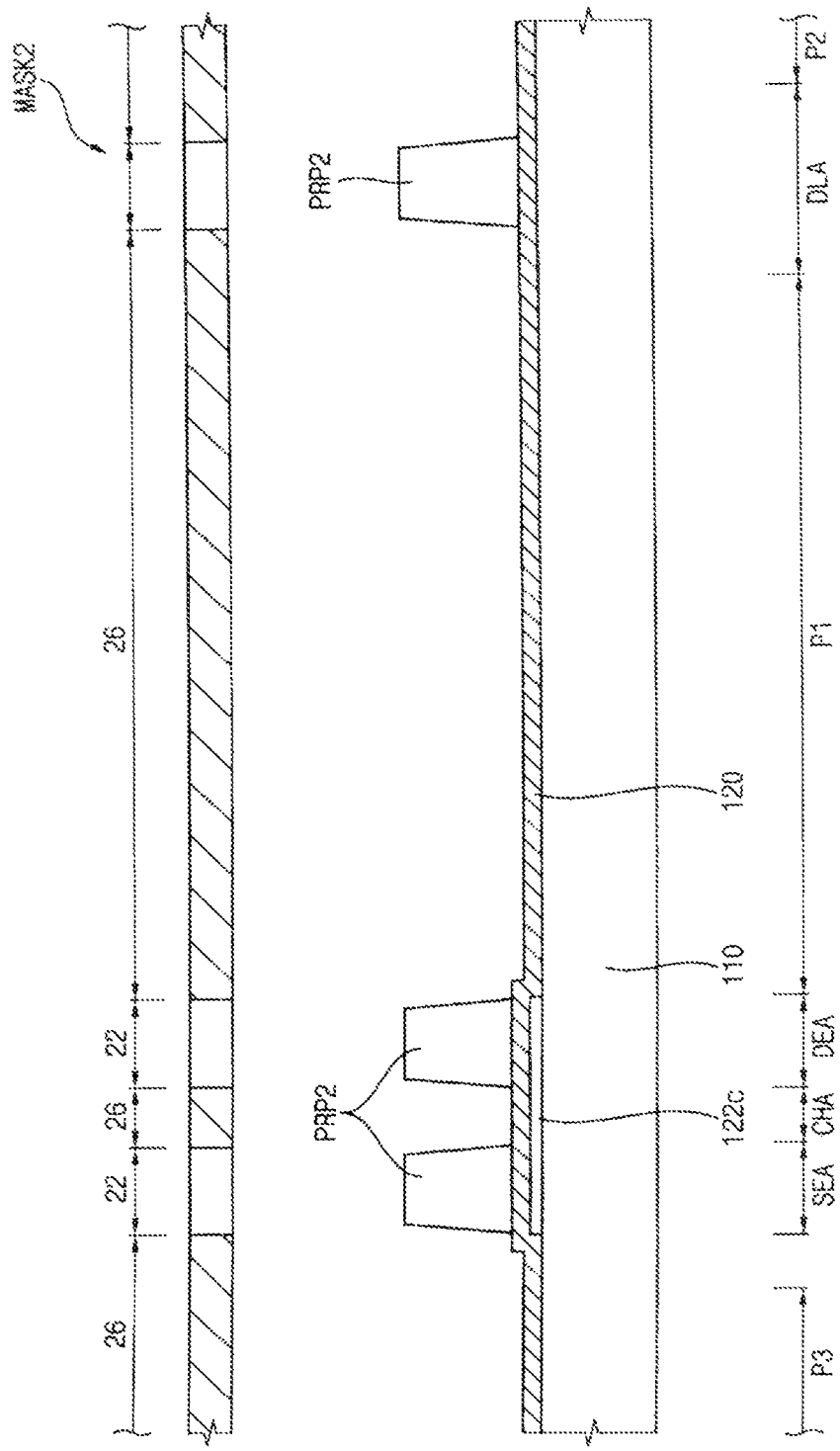

THIN-FILM TRANSISTOR, ARRAY SUBSTRATE HAVING THE THIN-FILM TRANSISTOR AND METHOD OF MANUFACTURING THE ARRAY SUBSTRATE

CROSS-REFERENCE TO RELATED APPLICATIONS

This application is a divisional of U.S. patent application Ser. No. 11/930,502, filed on Oct. 31, 2007, which claims priority to Korean Patent Application No. 10-2007-0058353, filed on Jun. 14, 2007, and all the benefits accruing therefrom under 35 US.C. §119, the contents of which in its entirety are herein incorporated by reference.

BACKGROUND OF THE INVENTION

1. Field of the Invention

The present invention relates to a thin-film transistor, an array substrate having the thin-film transistor and a method of manufacturing the array substrate. More particularly, the present invention relates to a thin-film transistor capable of enhancing the display quality of a display apparatus, an array substrate having the thin-film transistor and a method of manufacturing the array substrate.

2. Description of the Related Art

A liquid crystal display ("LCD") panel includes an array substrate having a switching element for driving a pixel, an opposite substrate facing the array substrate, and a liquid crystal layer disposed between the array substrate and the opposite substrate. The LCD panel displays an image by applying voltage to the liquid crystal layer to control transmittance of light.

The array substrate includes a thin-film transistor employed as the switching element of the array substrate. The thin-film transistor includes a gate electrode, a source electrode, a drain electrode, and a channel layer. According to the channel layer, the thin-film transistor is classified as either an amorphous silicon thin-film transistor, a poly silicon thin-film transistor, or a cadmium-selenium ("Cd—Se") thin-film transistor. Conventionally, the thin-film transistor employs amorphous silicon as the channel layer.

An optical band gap of the amorphous silicon is no higher than about 1.8 eV. Therefore, when the amorphous silicon is employed by the thin-film transistor as the channel layer, the amorphous silicon absorbs visible light having a wavelength of about 380 nm to about 780 nm corresponding to energy of 1.59 eV to about 3.26 eV to generate leakage current. When the thin-film transistor employing amorphous silicon is driven, the number of dangling bonds increases to induce an after-image and the thin-film transistor becomes unstable.

In order to solve the problem of the leakage current, the thin-film transistor has been formed as a bottom gate staggered type. However, the active layer activated by light still generates the leakage current since the light is not blocked by a gate electrode.

BRIEF SUMMARY OF THE INVENTION

The present invention has been made in an effort to solve the above-stated problems and aspects of the present invention provide a thin-film transistor capable of preventing the leakage current, an array substrate having the thin-film transistor, and a method of manufacturing the array substrate.

In an exemplary embodiment, the present invention provides a thin-film transistor which includes a semiconductor pattern formed on a base substrate and including a metal oxide, source and drain electrodes formed on the semiconductor pattern such that the source and drain electrodes are spaced apart from each other and an outline of the source and drain electrodes is substantially a same as an outline of the semiconductor pattern, and a gate electrode disposed in a region between the source and drain electrodes such that portions of the gate electrode are overlapped with the source and drain electrodes.

In another exemplary embodiment, the present invention provides an array substrate which includes a semiconductor pattern formed on a base substrate and including a metal oxide, a source pattern which includes a source electrode, a drain electrode, and a data line electrically connected to the source electrode, a gate pattern, and a pixel electrode. The source and drain electrodes are formed on the semiconductor pattern such that the source and drain electrodes are spaced apart from each other and an outline of the source and drain electrodes is substantially same as an outline of the semiconductor pattern. The gate pattern includes a gate electrode and a gate line electrically connected to the gate electrode and extended in a direction crossing the data line. The gate electrode is disposed in a region between the source and drain electrodes such that portions of the gate electrode are overlapped with the source and drain electrodes. The pixel electrode is disposed in a pixel portion and electrically connected to the drain electrode.

In another exemplary embodiment, the present invention provides a method of manufacturing an array substrate, the method including forming an oxide semiconductor layer, and a source metal layer of a base substrate, patterning an oxide semiconductor layer and a source metal layer to form a semiconductor pattern and a source pattern, respectively, the source pattern including a source electrode, a drain electrode, and a data line electrically connected to the source electrode, forming the source and drain electrodes on the semiconductor pattern such that the source and drain electrodes are spaced apart from each other and an outline of the source and drain electrodes is substantially a same as an outline of the semiconductor pattern, patterning a gate metal layer formed on the base substrate having the source pattern formed thereon, to form a gate pattern including a gate electrode and a gate line electrically connected to the gate electrode and extended in a direction crossing the data line, and forming a pixel electrode in a pixel portion of the base substrate such that the pixel electrode is electrically connected to the drain electrode.

In another exemplary embodiment, the present invention provides a method of manufacturing an array substrate, the method including patterning an oxide semiconductor layer on a base substrate to form a semiconductor pattern, patterning a source metal layer on the base substrate having the semiconductor pattern formed thereon, to form a source pattern including source and drain electrodes and a data line; forming the source and drain electrode on the semiconductor pattern such that the source and drain electrodes are overlapped with the semiconductor pattern and spaced apart from each other, the data line is electrically connected to the source electrode, patterning a gate metal layer on the base substrate having the source pattern formed thereon to form a gate electrode and a gate line electrically connected to the gate electrode and extended along a direction crossing the data line, and forming a pixel electrode in a pixel portion of the base substrate.

According to the thin-film transistor, the array substrate having the thin-film transistor and the method of manufacturing the array substrate, the semiconductor pattern includes metal oxide pattern. Therefore, leakage current induced by light is minimized. As a result, characteristics of the thin-film transistor are enhanced, and after-image is reduced to enhance display quality, which in turn stability of manufacturing process is enhanced.

BRIEF DESCRIPTION OF THE DRAWINGS

The above and other aspects, features, and advantages of the present invention will become more apparent from the following detailed description taken in conjunction with the accompanying drawings, in which:

FIG. 2 is a cross-sectional view illustrating an exemplary embodiment of an array substrate according to the present invention, which is taken along a line I-I' in FIG. 1;

FIGS. 3A through 3I are cross-sectional views illustrating an exemplary embodiment of a method of manufacturing the array substrate in FIG. 2, according to the present invention;

FIGS. 5A and 5B are cross-sectional views illustrating an exemplary embodiment of a method of manufacturing the array substrate in FIG. 4, according to the present invention;

FIGS. 7A through 7C are cross-sectional views illustrating an exemplary embodiment of a method of manufacturing the array substrate in FIG. 6, according to the present invention;

FIGS. 9A and 9B are cross-sectional views illustrating an exemplary embodiment of a method of manufacturing the array substrate in FIG. 8;

FIG. 10 is a cross-sectional view illustrating another exemplary embodiment of an array substrate according to the present invention, which is taken along the line I-I' in FIG. 1;

FIGS. 11A through 11C are cross-sectional views illustrating an exemplary embodiment of a method of manufacturing the array substrate in FIG. 10;

FIG. 14 is a cross-sectional view illustrating another exemplary embodiment of an array substrate according to the present invention, which is taken along the line I-I' in FIG. 1;

FIG. 16 is a cross-sectional view illustrating another exemplary embodiment of an array substrate according to the present invention, which is taken along the line I-I' in FIG. 1;

FIGS. 18A and 18B are cross-sectional views illustrating an exemplary embodiment of a method of manufacturing the array substrate in FIG. 17 according to the present invention.

DETAILED DESCRIPTION OF THE INVENTION

Figure 1:
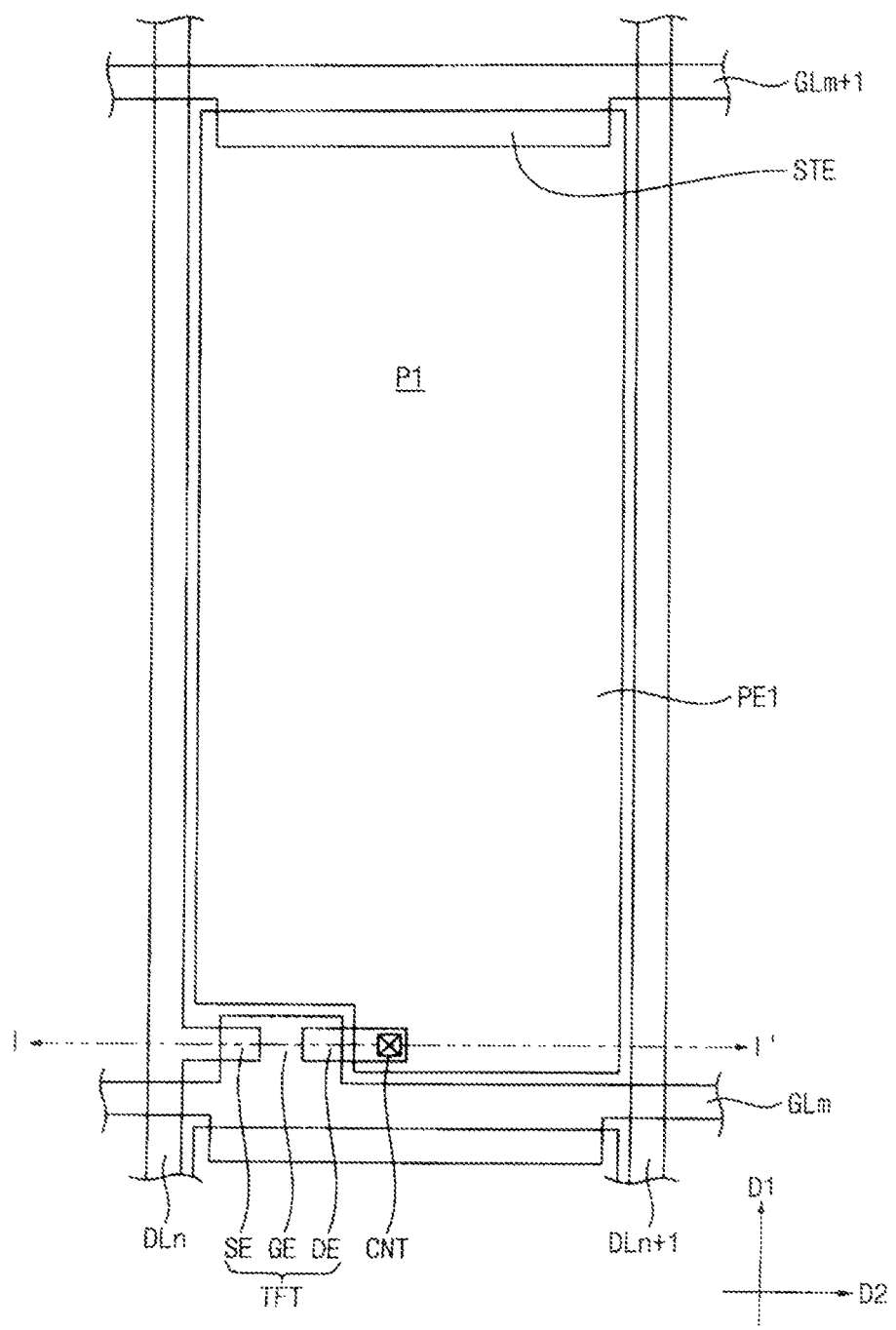
FIG. 1 is a layout illustrating an exemplary embodiment of a portion of an array substrate according to the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained with reference to the accompanying drawings.

FIG. 1 is a layout illustrating an exemplary embodiment of a portion of an array substrate, according to the present invention.

Referring to FIG. 1, an array substrate includes data lines DLn and DLn+1, gate lines GLm and GLm+1, a storage electrode STE, a thin-film transistor TFT which is a switching element, and a first pixel electrode PE1, wherein 'n' and 'm' are integers.

The data lines DLn and DLn+1 are extended along a first direction D1 of a base substrate 110 (shown in FIG. 2, for example), and arranged parallel along a second direction D2 which is different from the first direction D1. The first direction D1 and the second direction D2 are perpendicular to each other. In other words, n-th data line DLn and (n+1)-th data line DLn+1 are extended along the first direction D1, and the (n+1)-th data line DLn+1 are disposed parallel with the n-th data line DLn along the second direction D2.

The gate lines GLm and GLm+1 are extended along the second direction D2 of the base substrate 110, and arranged parallel along the first direction D1. That is, m-th gate line GLm and (m+1)-th gate line GLm+1 are extended along the second direction D2, and the (m+1)-th gate line GLm+1 is disposed in parallel with the m-th gate line GLm along the first direction D1. The gate lines GLm and GLm+1 cross the data lines DLn and DLn+1, so that a first pixel portion P1 may be defined.

According to an exemplary embodiment, the first pixel portion P1 includes a storage capacitor electrically connected to, for example, the (m+1)-th gate line GLm+1. The storage capacitor includes a storage electrode STE, a first pixel electrode PE1, and an insulation layer (not shown). The storage electrode STE is extended from the (m+1)-th gate line GLm+1. The first pixel electrode PE1 is overlapped with the storage electrode STE. The insulation layer is disposed between the storage electrode STE and the first pixel electrode PE1.

According to an exemplary embodiment, the thin-film transistor TFT includes a source electrode SE, a drain electrode DE, and a gate electrode GE. According to an exemplary embodiment, the source electrode SE is electrically connected to the n-th data line DLn, and the drain electrode DE is spaced apart from the source electrode SE. The gate electrode GE is electrically connected to the m-th gate line GLm, and overlapped with portions of the source electrode SE and the drain electrode DE.

The first pixel electrode PE1 is formed in the first pixel portion P1, and electrically connected to the thin-film transistor TFT. In the current embodiment, the first pixel electrode PE1 is electrically connected to the drain electrode DE through a contact hole CNT.

FIG. 2 is a cross-sectional view illustrating an exemplary embodiment of an array substrate according to the present invention, which is taken along a line I-I' in FIG. 1.

Referring to FIGS. 1 and 2, the array substrate 101 according to an exemplary embodiment includes a base substrate 110, a first semiconductor pattern 122a, a second semiconductor pattern 122b, data lines DLn and DLn+1, a source electrode SE, a drain electrode DE, a first insulation layer 140, gate lines GLm and GLm+1, a gate electrode GE, a second insulation layer 160, and pixel electrodes PE1, PE2 and PE3.

The first semiconductor pattern 122a is formed on the base substrate 110 in a source region SEA, a drain region DEA, and a channel region CHA. The second semiconductor pattern 122b is formed on the base substrate 110 in a data line region DLA. According to an exemplary embodiment, the first and second semiconductor patterns 122a and 122b include an oxide semiconductor layer.

According to an exemplary embodiment, the oxide semiconductor layer may include zinc oxide, indium oxide, tin oxide, gallium oxide or aluminum oxide. According to an exemplary embodiment, the oxide semiconductor layer may have a single oxide semiconductor such as zinc oxide, indium oxide, etc. Alternatively, according to another exemplary embodiment, the oxide semiconductor layer may include mixed oxide semiconductor such as gallium indium zinc oxide ("$Ga_2O_3$—$In_2O_3$—ZnO"), indium gallium tin oxide ("$In_2O_3$—$Ga_2O_3$—SnO"), indium zinc oxide ("$In_2O_3$—$Zn_2O_3$"), zinc aluminum oxide ("$Zn_2O_3$—$Al_2O_3$"), etc. According to an exemplary embodiment, the oxide semiconductor layer may further include metal oxide including beryllium (Be), magnesium (Mg), calcium (Ca), strontium (Sr), barium (Ba), radium (Ra), thallium (Tl), scandium (Sc), yttrium (Y), lanthanum (La), actinium (Ac), titanium (Ti), zirconium (Zr), hafnium (Hf) or rutherfordium (Rf), etc. These metal oxides may be used alone or in a combination thereof.

The source and drain electrodes SE and DE are formed on the first semiconductor pattern 122a. The source electrode SE is electrically connected to the n-th data line DLn. The source electrode SE and the n-th data line DLn are formed from a source metal layer. The (n+1)-th data line DLn+1 is formed on the second semiconductor pattern 122b of the data line region DLA. The drain electrode DE is spaced apart from the source electrode SE. The drain electrode DE is formed from the source metal layer.

The source and drain electrodes SE and DE expose a portion of the first semiconductor pattern 122a of the channel region CHA. According to an exemplary embodiment, the source and drain electrodes SE and DE may have a substantially same outline as the first semiconductor pattern 122a. Further, the (n+1)-th data line DLn+1 may have a substantially same outline as the second semiconductor pattern 122b.

Alternatively, according to another exemplary embodiment, the source and drain electrodes SE and DE may be extended to make contact with the base substrate 110, covering the end portions of the first semiconductor pattern 122a. That is, the source and drain electrodes SE and DE may be formed on the first semiconductor pattern 122a and the base substrate 110. The second semiconductor pattern 122b may be omitted, so that the (n+1)-th data line DLn+1 may be formed directly on the base substrate 110 to make contact with the base substrate 110.

According to an exemplary embodiment, the source metal layer may have a single layered structure or a multi-layered structure having at least two stacked metal layers having different physical and chemical characteristics. When the source metal layer has a multi-layered structure, a metal layer of the source metal layer, which makes contact with the first and second semiconductor patterns 122a and 122b, corresponds to an ohmic contact layer. That is, the source metal layer may include a first metal layer (not shown) transmitting electric signal, and a second metal layer (not shown) disposed between the first metal layer and the first semiconductor pattern 122a and corresponding to the ohmic contact layer. According to an exemplary embodiment, the first metal layer includes silver (Ag), and the second metal layer includes molybdenum (Mo).

The first insulation layer 140 is formed on the base substrate 110 having the data lines DLn and DLn+1, the source electrode SE and the drain electrode DE formed thereon. The first insulation layer 140 includes a first hole of the contact hole CNT, which exposes a portion of the drain electrode DE.

The gate electrode GE and the gate lines GLm and GLm+1 are formed on the base substrate 110 having the first insulation layer 140 formed thereon. The gate electrode GE is electrically connected to the m-th gate line GLm. The gate electrode GE and the gate line GLm are formed from a gate metal layer 150 (shown in FIG. 3G, for example). The gate electrode GE is disposed on the first insulation layer 140 of the channel region CHA. The gate electrode GE may be extended from the channel region CHA to a portion of the source region SEA and the drain region DEA to be overlapped with the source electrode SE and the drain electrode DE, respectively. The gate metal layer 150 may have a single layered structure or a multi-layered structure having at least two stacked layers, each of which has different physical and chemical characteristics.

The second insulation layer 160 covers the base substrate 110 having the thin-film transistor TFT. According to an exemplary embodiment, the second insulation layer 160 is formed on the gate lines GLm and GLm+1, the gate electrode GE, the pixel portions P1, P2 and P3, and the first insulation layer 140 of the data line region DLA. The second insulation layer 160 includes a second hole of the contact hole CNT, which corresponds to the first hole of the first insulation layer 140 in order to expose the portion of the drain electrode DE.

Alternatively, according to another exemplary embodiment, an organic layer (not shown) may be formed on the base substrate 110 having the gate electrode GE and the gate lines GLm and GLm+1 to make contact with the gate electrode GE and the gate lines GLm and GLm+1 instead of the second insulation layer 160.

The pixel electrodes PE1, PE2 and PE3 are respectively formed in the pixels P1, P2 and P3 of the base substrate 110. According to an exemplary embodiment, the first pixel electrode PE1 is formed on the first pixel portion P1 of the base substrate 110, and electrically connected to the thin-film transistor TFT in the first pixel portion P1. The second pixel electrode PE2 is formed in the second pixel portion P2 adjacent to the first pixel portion P1. Particularly, the (n+1)-th data line DLn+1 is disposed between the first and second pixel portions P1 and P2. The third pixel electrode PE3 is formed in the third pixel portion P3 of the base substrate 110. According to an exemplary embodiment, the first, second and third pixel electrodes PE1, PE2 and PE3 may have patterns for controlling liquid crystal molecules.

FIGS. 3A through 3I are cross-sectional views illustrating an exemplary embodiment of a method of manufacturing the array substrate in FIG. 2, according to the present invention.

Figure 3A:
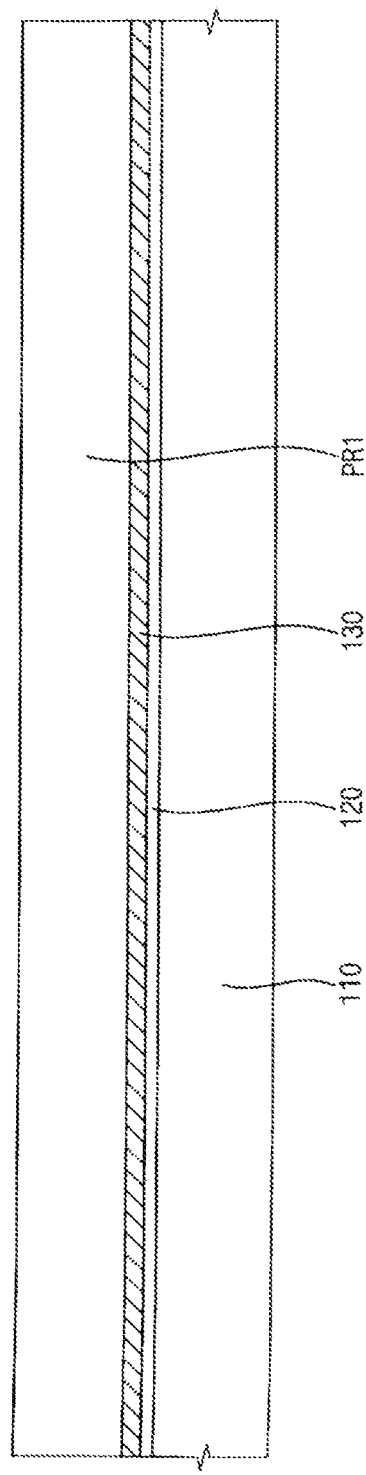

Referring to FIG. 3A, an oxide semiconductor layer 120 and a source metal layer 130 are sequentially formed on the base substrate 110.

The base substrate 110 includes an optically transparent material transmitting light. According to an exemplary embodiment, the base substrate 110 includes a material such as glass, soda lime, plastic, etc.

According to an exemplary embodiment, the oxide semiconductor layer 120 may be formed on the base substrate 110 through, for example a sputtering method. The source metal layer 130 is formed on the base substrate 110 having the oxide semiconductor layer 120 formed thereon. The source metal layer 130 may be formed on the oxide semiconductor layer 120 through, for example a sputtering method.

According to an exemplary embodiment, the oxide semiconductor layer 120 may include zinc oxide, indium oxide, tin oxide, gallium oxide or aluminum oxide, for example. The oxide semiconductor layer 120 may have a single oxide semiconductor such as zinc oxide, indium oxide, etc. Alternatively, according to another exemplary embodiment, the oxide semiconductor layer 120 may include mixed oxide semiconductor such as gallium indium zinc oxide ("$Ga_2O_3$—$In_2O_3$—ZnO"), indium gallium tin oxide ("$In_2O_3$—$Ga_2O_3$—SnO"), indium zinc oxide ("$In_2O_3$—$Zn_2O_3$"), zinc aluminum oxide ("$Zn_2O_3$—$Al_2O_3$"), etc. According to an exemplary embodiment, the oxide semiconductor layer 120 may further include metal oxide including beryllium (Be), magnesium (Mg), calcium (Ca), strontium (Sr), barium (Ba), radium (Ra), thallium (Tl), scandium (Sc), yttrium (Y), lanthanum (La), actinium (Ac), titanium (Ti), zirconium (Zr), hafnium (Hf) or rutherfordium (Rf), etc. These may be used alone or in a combination thereof.

According to an exemplary embodiment, the source metal layer 130 may have a single layered structure or a multi-layered structure having at least two stacked metal layers having different physical and chemical characteristics. The source metal layer 130 may include, for example aluminum (Al), copper (Cu), molybdenum (Mo), titanium (Ti), tantalum (Ta), tungsten (W), neodymium (Nb), chromium (Cr), silver (Ag), etc. These may be used alone or in a combination thereof.

A first photoresist film PR1 is formed on the base substrate 110 having the oxide semiconductor layer 120 and the source metal layer 130 formed thereon. For example, the first photoresist film PR1 includes a negative-type photoresist material of which exposed region is cured to remain and unexposed region is removed by developing solution. The first photoresist film PR1 may be formed on the source metal layer 130 through a spin coating method or a slit coating method, for example.

Figure 3B:
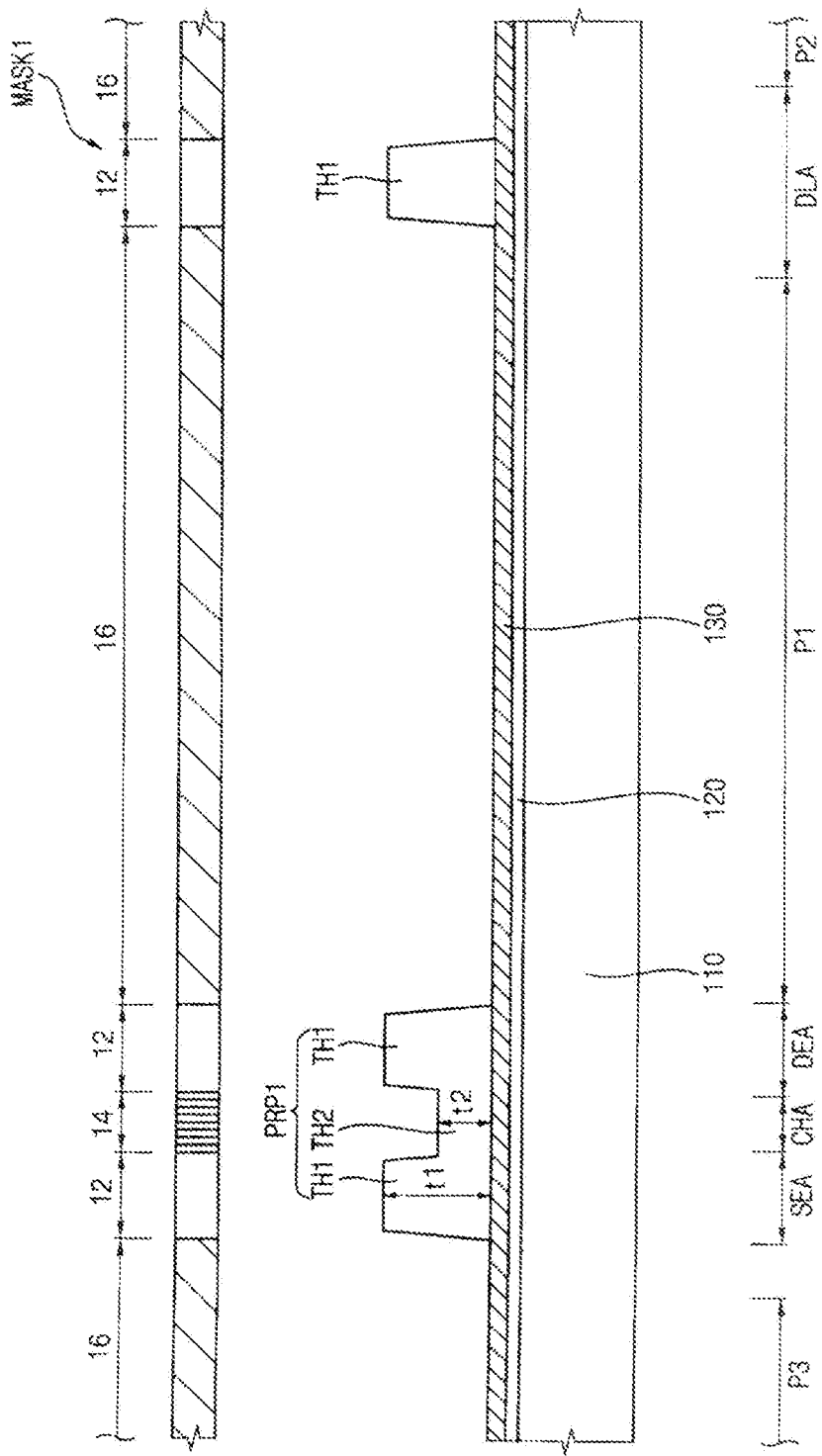

Referring to FIG. 3B, a first mask MASK1 is disposed over the base substrate 110 having the first photoresist film PR1 formed thereon, and then light is irradiated onto the base substrate 110 having the photoresist film PR1 formed thereon through the first mask MASK1. Then, a portion of the photoresist film PR1, which is not exposed to the light and not cured, is removed by the developing solution to form the first photoresist pattern PRP1 on the source metal layer 130. The first photoresist pattern PRP1 includes a first thickness portion TH1 and a second thickness portion TH2.

According to an exemplary embodiment, the first mask MASK1 may be a slit mask having a diffraction portion 14. Alternatively, according to another exemplary embodiment, the first mask MASK1 may be a half tone mask having semi-transmissive portion.

According to an exemplary embodiment, the first mask MASK1 includes an opening portion 12, the diffraction portion 14, and a light blocking portion 16.

The first mask MASK1 is disposed such that the opening portion 12 corresponds to the source region SEA, the drain region DEA and the data line region DLA of the base substrate 110. The first photoresist film PR1 corresponding to the opening portion 12 is cured to form the first thickness portion TH1 remaining on the source metal layer 130. The first thickness portion TH1 includes a first thickness t1. According to an exemplary embodiment, the first thickness t1 may be substantially same as a thickness of the first photoresist film PR1.

The first mask MASK1 is disposed such that the diffraction portion 14 corresponds to the channel region CHA of the base substrate 110. The first photoresist film PR1 corresponding to the diffraction portion 14 forms the second thickness portion TH2 including a second thickness t2. The second thickness t2 is smaller than the first thickness t1.

The light blocking portion 16 of the first mask MASK1 corresponds to a region except for the source region SEA, the drain region DEA, the data line region DLA and the channel region CHA. According to an exemplary embodiment, the light blocking portion 16 may correspond to the first, second and third pixel portions P1, P2 and P3. The first photoresist film PR1 corresponding to the light blocking portion 16 is removed by the developing solution to expose the source metal layer 130.

Alternatively, according to another exemplary embodiment, the first photoresist film PR1 may include a positive type photoresist material. A first portion of the photoresist film PR1 including the positive type photoresist material, which is exposed, is removed by a developing solution, and a second portion of the photoresist film PR1, which is unexposed, is cured to remain. Therefore, when the first photoresist film PR1 includes a positive type photoresist material, positions of the opening portion 12 and the light blocking portion 16 are reversed.

Figure 3C:
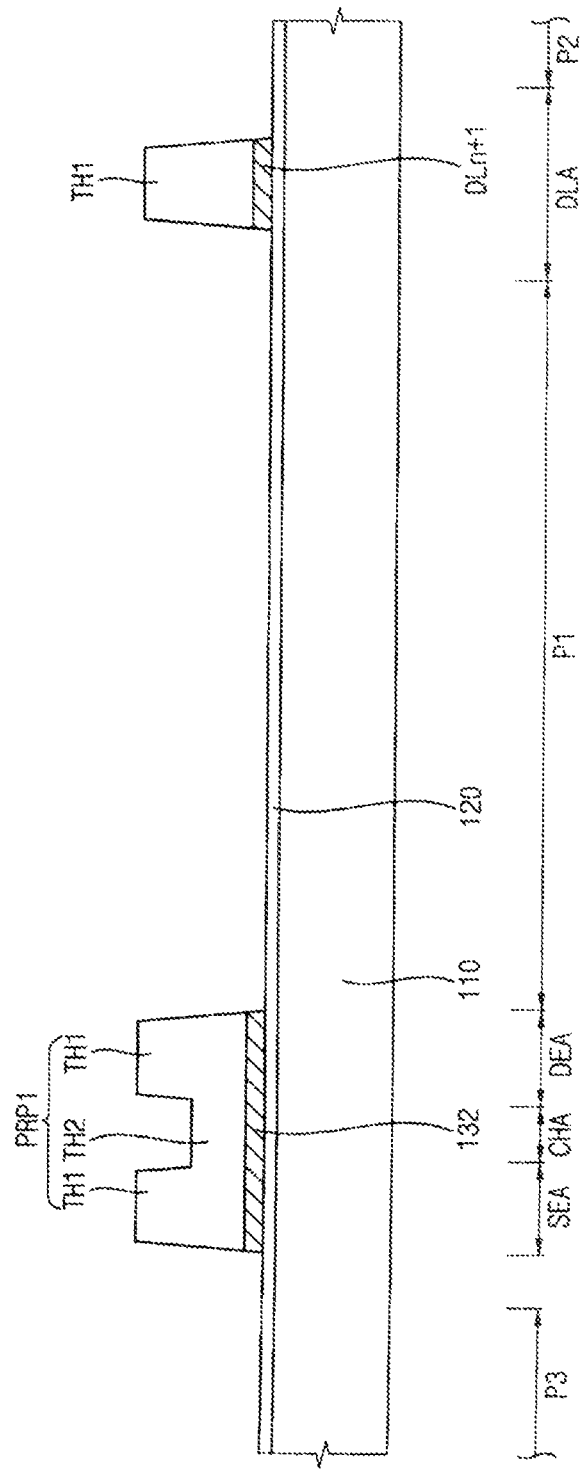

Referring to FIG. 3C, the source metal layer 130 is etched using the first photoresist pattern PRP1 as a mask to form a source remaining pattern 132.

The source remaining pattern 132 is formed on the oxide semiconductor layer 120 of the source region SEA, the channel region CHA, and the drain region DEA. The source remaining pattern 132 may be electrically connected to the n-th data line (not shown). The (n+1)-th data line DLn+1, which is substantially parallel with the n-th data line, is formed in the data line region DLA of the base substrate 110.

According to an exemplary embodiment, the source metal layer 130 may be patterned through a wet etch method using a first etch solution. When the source metal layer 130 includes copper (Cu), the first etch solution may be hydrogen peroxide ("$H_2O_2$") based. The first etch solution may further include hydrofluoric acid ("HF-d($H_2O$)", 0<d<1). According to an exemplary embodiment, the first etch solution may include hydrogen peroxide ("$H_2O_2$") of about 10% to about 20% by volume, and hydrofluoric acid ("HF-d($H_2O$)", 0<d<1) of about 0.01% to about 0.5% by volume. In other words, the first etch solution of about 1000 ml may include hydrogen peroxide ("$H_2O_2$") of about 100 ml to about 200 ml, and hydrofluoric acid ("HF-d($H_2O$)", 0<d<1) of about 0.1 ml to about 5 ml. The first etch solution etches the source metal layer 130 by an etch rate of about 60 Å/sec, and the first etch solution etches the oxide semiconductor layer 120 by an etch rate of about 0.17 Å/sec. Therefore, even though the first etch solution is used for the source metal layer 130, the oxide semiconductor layer 120 is not damaged.

Referring to FIG. 3D, the oxide semiconductor layer 120 is etched using the first photoresist pattern PRP1, the source remaining pattern 132 and the (n+1)-th data line DLn+1 as a mask. The oxide semiconductor layer 120 remaining on the base substrate 110 forms the first and second semiconductor patterns 122a and 122b.

According to an exemplary embodiment, the first semiconductor pattern 122a is formed in the source region SEA, the channel region CHA, and the drain region DEA such that the first semiconductor pattern 122a has the substantially same outline as the source remaining pattern 132. The second semiconductor pattern 122b is formed in the data line region DLA such that the second semiconductor pattern 122b has the substantially same outline as the (n+1)-th data line DLn+1.

The first and second semiconductor patterns 122a and 122b may be formed through a wet etch method using a second etch solution. The second etch solution includes hydrochloric acid (HCl), acetic acid ("$CH_3COOH$"), nitric acid ("$HNO_3$") and sulfuric acid ("$H_2SO_4$"). The second etch solution may further include hydrofluoric acid ("HF-d ($H_2O$)", 0<d<1). For example, the second etch solution includes hydrochloric acid (HCl) of about 0.1% to about 10% by volume, acetic acid ("$CH_3COOH$") of about 0.1% to about 10% by volume, nitric acid ("$HNO_3$") of about 0.1% to about 10% by volume, and sulfuric acid ($H_2SO_4$) of about 1% to about 30% by volume. In other words, the second etch solution of about 1000 ml may include hydrochloric acid (HCl) of about 1 ml to about 100 ml, acetic acid ("$CH_3COOH$") of about 1 ml to about 100 ml, nitric acid ("$HNO_3$") of about 1 ml to about 100 ml, and sulfuric acid ("$H_2SO_4$") of about 10 ml to about 300 ml. The second etch solution etches the oxide semiconductor layer 120 by an etch rate of no less than about 7 Å/sec, and the second etch solution etches the source metal layer 130 by an etch rate of no more about 0.5 Å/sec. Therefore, even though the second etch solution is used for forming the first and second semiconductor patterns 122a and 122b, the source remaining pattern 132 and the (n+1)-th data line DLn+1 are not damaged.

Alternatively, the semiconductor layer 120 may be patterned through a dry etch process to form the first and second semiconductor patterns 122a and 122b. Gas for the dry etch process may include methane gas ($CH_4$), argon gas (Ar), and tri-fluoromethane ($CHF_3$).

Figure 3E:
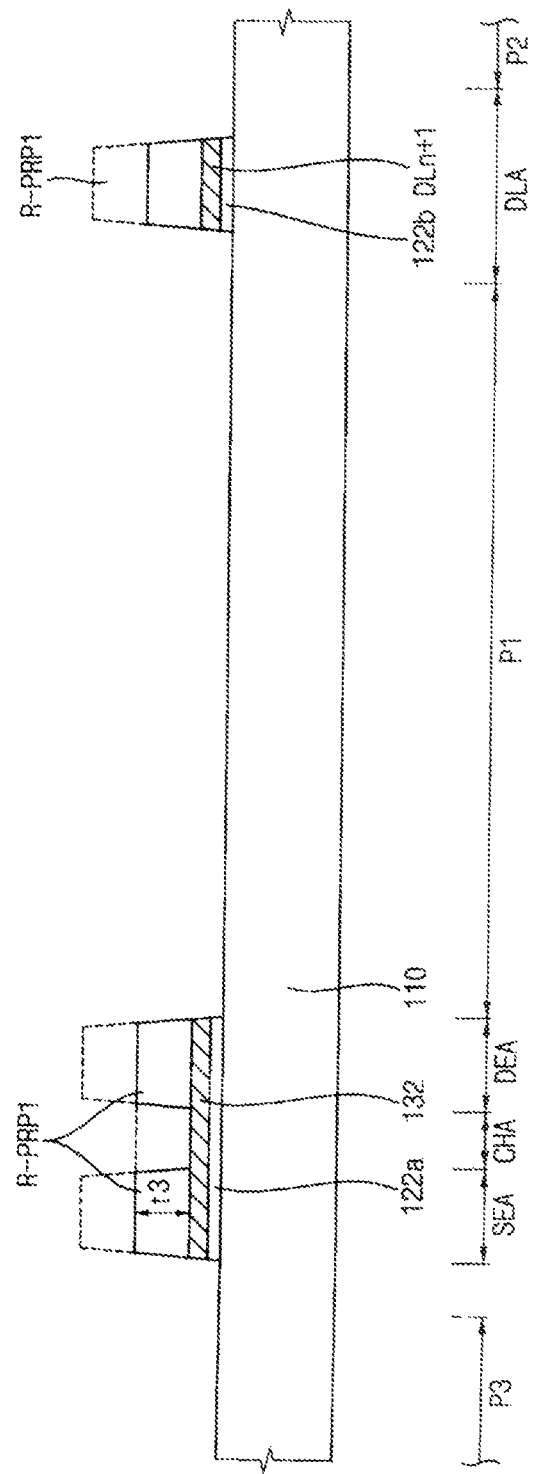

Referring to FIG. 3E, the second thickness portion TH2 of the first photoresist pattern PRP1 is removed to form the first remaining pattern R-PRP1.

The first remaining pattern R-PRP1 is formed in the source region SEA, the drain region DEA, and the data line region DLA. When the second thickness portion TH2 is removed, the source remaining pattern 132 of the channel region CHA is exposed. The first remaining pattern R-PRP1 may be formed by ashing the first photoresist pattern PRP1 through oxygen plasma. The first remaining pattern R-PRP1 remains on the source remaining pattern 132 and includes a third thickness t3. The third thickness t3 of the first remaining pattern R-PRP1 may be substantially same as a difference between the first and second thicknesses t1 and t2.

Referring to FIG. 3F, a portion of the source remaining pattern 132 is removed using the first remaining pattern R-PRP1.

As a result, the source SE is formed on the first semiconductor pattern 122a of the source region SEA. The drain electrode DE is formed on the first semiconductor pattern 122a of the drain region DEA. The source and drain electrodes SE and DE are spaced apart from each other by the channel region CHA. The first semiconductor pattern 122a is exposed between the source and drain electrodes SE and DE. By using the first etch solution, the source remaining pattern 132 of the channel layer CHA may be removed.

The first and second semiconductor patterns 122a and 122b may be patterned, and the data line DLn+1 and the source pattern including the source electrode SE and the drain electrode DE may be patterned through the oxide semiconductor layer 120 and the source metal layer 130 as a mask.

Figure 3G:
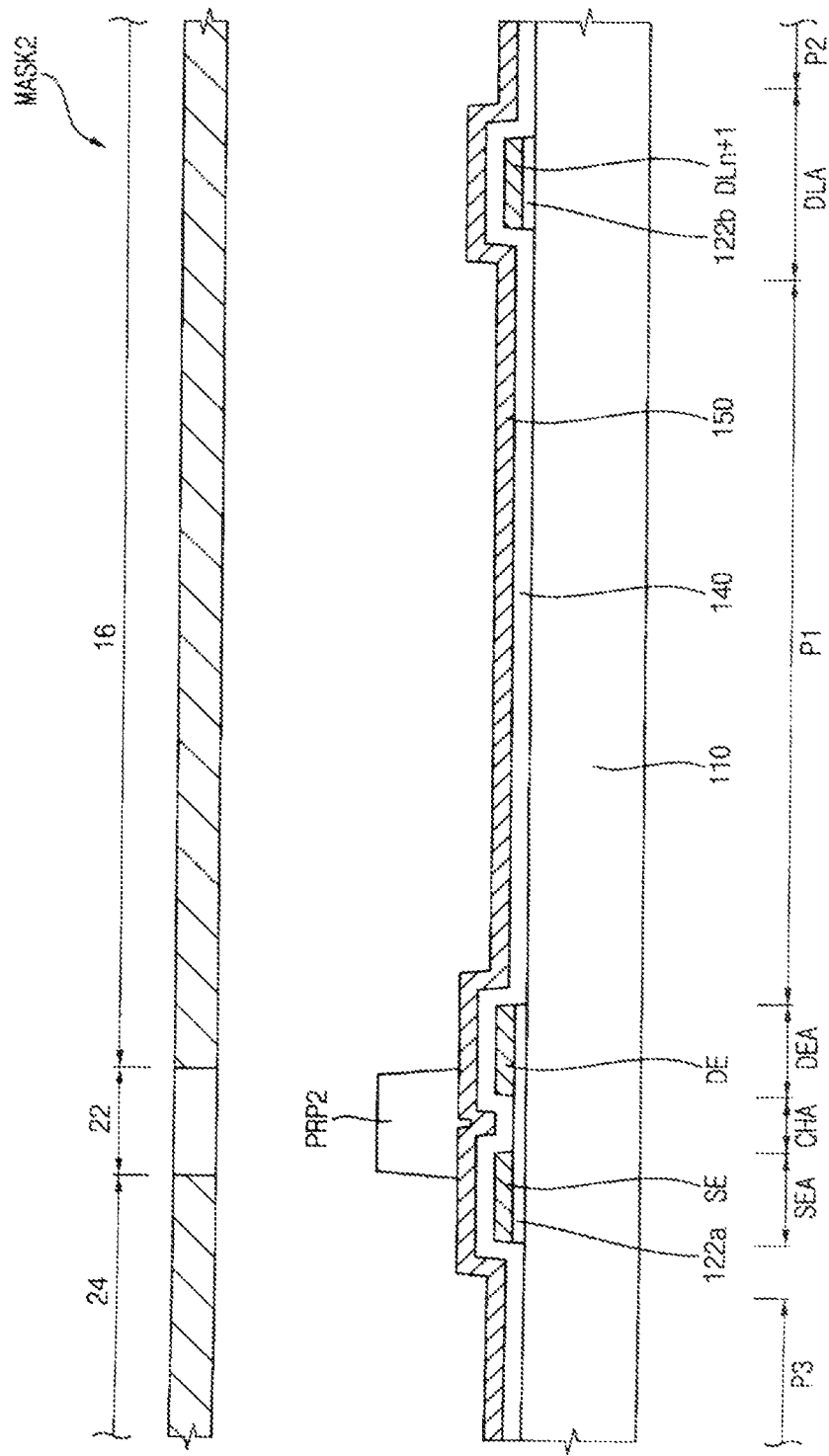

Referring to FIG. 3G, the first insulation layer 140 is formed on the base substrate 110 having the source pattern including the source electrode SE, the drain electrode DE, and the data line DLn+1 formed thereon. The first insulation layer 140 includes, for example, organic material, silicon nitride ("SiNx", $0<x<1$), silicon oxide ("SiOx", $0<x<1$) or silicon nitride oxide ("SiOxN(1-x)", $0<x<1$).

A gate metal layer 150 is formed on the base substrate 110 having the first insulation layer 140 formed thereon. According to an exemplary embodiment, the gate metal layer 150 may be formed on the first insulation layer 140 through a sputtering method. The gate metal layer 150 may have no less than two layers having different physical and chemical characteristics. The gate metal layer 150 includes, for example, aluminum (Al), copper (Cu), molybdenum (Mo), titanium (Ti), tantalum (Ta), tungsten (W), neodymium (Nb), chromium (Cr), silver (Ag), etc. These may be used alone or in a combination thereof.

A second photoresist film (not shown) is formed on the base substrate 110 having the gate metal layer 150 formed thereon. According to an exemplary embodiment, the second photoresist film may be formed on the gate metal layer 150 through a spin coating method or a slit coating method. The second photoresist film may include a negative type photoresist material.

When the second photoresist film is formed on the gate metal layer 150, a second mask MASK2 is disposed over the base substrate 110. The second mask MASK2 includes an opening portion 22 and a light blocking portion 24. When light is irradiated onto the second photoresist film through the second mask MASK2, and a portion, which is not cured, is removed by a developing solution, a second photoresist pattern PRP2 is formed. The second photoresist pattern PRP2 is formed on the gate metal layer 150 of the channel region CHA and extended regions from the channel region CHA toward the source and drain regions SEA and DEA.

Figure 3H:
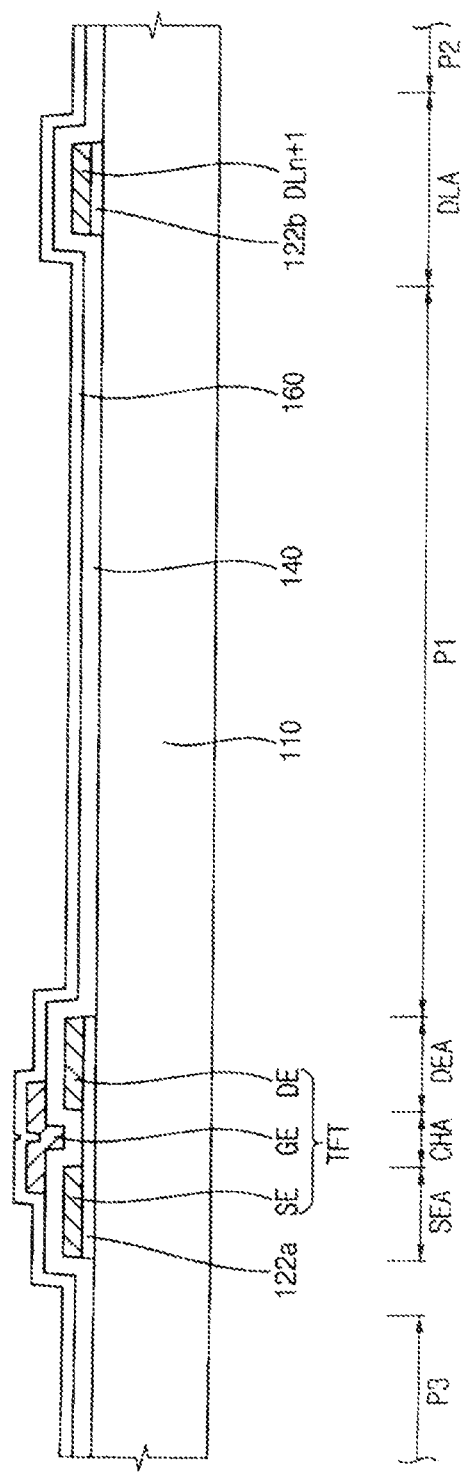
Figure 31:
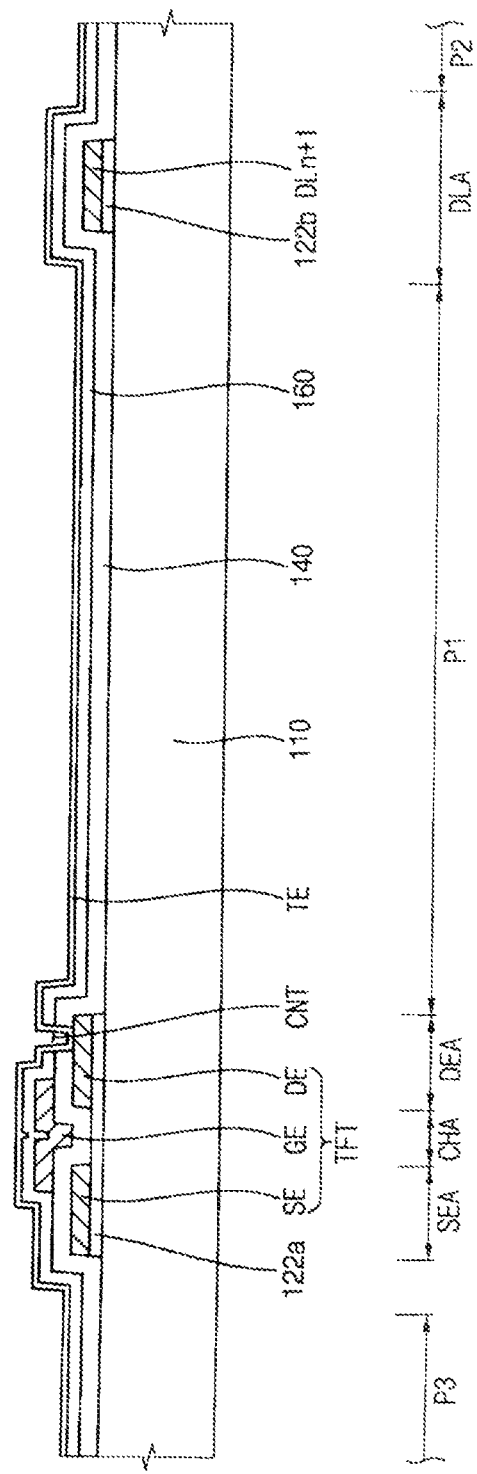

Referring to FIG. 3H, the gate metal layer 150 is patterned using the second photoresist pattern PRP2 as a mask to form a gate pattern including the gate electrode GE and gate lines (not shown).

The gate electrode GE is formed on the first insulation layer 140 of the channel region CHA such that the gate electrode GE is overlapped with the source and drain electrodes SE and DE. The gate electrode GE is electrically connected to one of the gate lines.

The second insulation layer 160 is formed on the base substrate 110 having the gate pattern including the gate electrode GE and the gate lines formed thereon. The second insulation layer 160 makes contact with the gate electrode GE and the gate lines. The second insulation layer 160 also makes contact with the first insulation layer 140 of the first, second and third pixel portions P1, P2 and P3. The second insulation layer 160 includes, for example, an organic material, silicon nitride ("SiNx", $0<x<1$), silicon oxide ("SiOx", $0<x<1$) or silicon nitride oxide ("SiOxN(1-x)", $0<x<1$).

Referring to FIG. 3I, a contact hole CNT exposing a portion of the drain electrode DE is formed. The contact hole CNT may be formed by etching the first and second insulation layers 140 and 160 through a conventional photolithography method. The first and second insulation layers 140 and 160 may be dry etched using gas.

According to an exemplary embodiment, a transparent conductive layer TE is formed on the base substrate 110 having the contact hole CNT. The transparent conductive layer TE may be formed on the second insulation layer 160 through, for example, a sputtering method. The transparent conductive layer TE includes, for example, indium zinc oxide ("IZO"), indium tin oxide ("ITO"), etc. The transparent conductive layer TE is electrically connected to the drain electrode through the contact hole CNT. When the transparent conductive layer TE is patterned through a conventional photolithography process, the first, second and third pixel electrodes PE1, PE2 and PE3 are formed. The first, second and third pixel electrodes PE1, PE2 and PE3 may have patterns (not shown) for controlling liquid crystal molecules.

Figure 4:
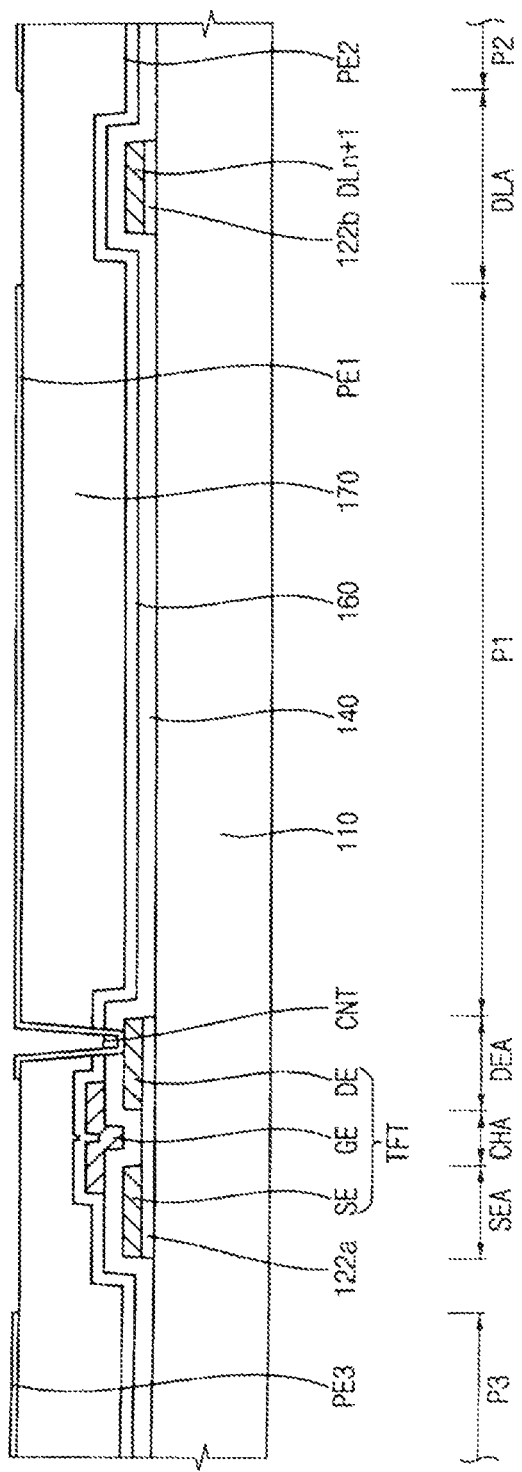
FIG. 4 is a cross-sectional view illustrating another exemplary embodiment of an array substrate according to the present invention, which is taken along the line I-I' in FIG. 1.

FIG. 4 is a cross-sectional view illustrating an exemplary embodiment of an array substrate according to the present invention, which is taken along the line I-I' in FIG. 1.

Referring to FIGS. 1 and 4, the array substrate 102 according to an exemplary embodiment includes a base substrate 110, a first semiconductor pattern 122a a second semiconductor pattern 122b, data lines DLn and DLn+1, a source electrode SE, a drain electrode DE, a first insulation layer 140, gate lines GLm and GLm+1, a gate electrode GE, a second insulation layer 160, an organic layer 170, and pixel electrodes PE1, PE2 and PE3. The array substrate 102 is substantially the same as that shown in FIG. 2 except for an organic layer 170. Thus, the same reference numerals will be used to refer to the same or like parts as those shown in FIG. 2 and any further explanation concerning the above elements will be omitted.

The first semiconductor pattern 122a is formed on the base substrate 110 in a source region SEA, a drain region DEA and a channel region CHA. The first semiconductor pattern 122a includes an oxide semiconductor layer.

According to an exemplary embodiment, the oxide semiconductor layer may include zinc oxide, indium oxide, tin oxide, gallium oxide or aluminum oxide. The oxide semiconductor layer may have a single oxide semiconductor such as zinc oxide, indium oxide, etc. Alternatively, according to another exemplary embodiment, the oxide semiconductor layer may include mixed oxide semiconductor such as gallium indium zinc oxide ("$Ga_2O_3$—$In_2O_3$—ZnO"), indium gallium tin oxide ("$In_2O_3$—$Ga_2O_3$—SnO"), indium zinc oxide ("$In_2O_3$—$Zn_2O_3$"), zinc aluminum oxide ("$Zn_2O_3$—$Al_2O_3$"), etc. The oxide semiconductor layer may further include metal oxide including beryllium (Be), magnesium (Mg), calcium (Ca), strontium (Sr), barium (Ba), radium (Ra), thallium (Tl), scandium (Sc), yttrium (Y), lanthanum (La), actinium (Ac), titanium (Ti), zirconium (Zr), hafnium (Hf) or rutherfordium (Rf), etc. These may be used alone or in a combination thereof.

The organic layer 170 is formed on the second insulation layer 160. For example, the organic layer 170 is formed on the second insulation layer 160 disposed on the gate electrode GE and the gate lines GLm and GLm+1. The organic layer 170 may be formed on the second insulation layer 160 of the first, second and third pixels P1, P2 and P3 and the data line region DLA. The organic layer 170 is relatively thicker than other layers to planarize a surface of the array substrate 102.

The first, second and third pixel electrodes PE1, PE2 and PE3 are formed on the organic layer 170. The first pixel electrode PE1 is electrically connected to the drain electrode DE through the contact hole CNT, so that the first pixel electrode is electrically connected to the thin-film transistor TFT.

Figure 5B:
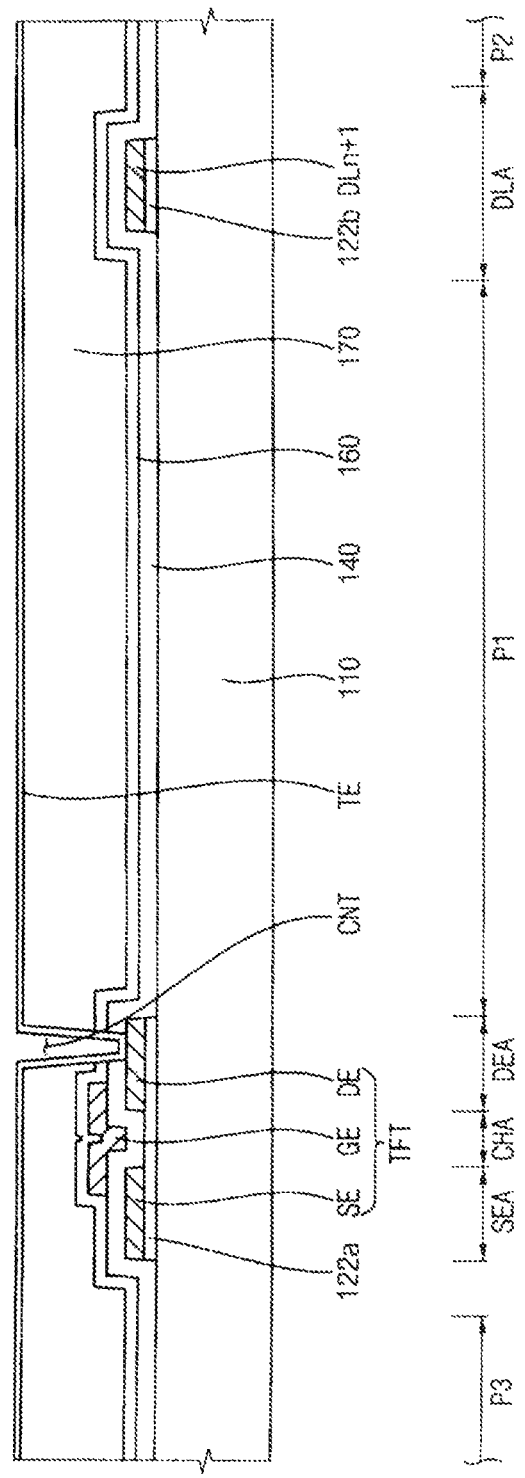

FIGS. 5A and 5B are cross-sectional views illustrating an exemplary embodiment of a method of manufacturing the array substrate in FIG. 4, according to the present invention.

The method of manufacturing the array substrate, in FIG. 5A is substantially the same as the method in FIGS. 3A through 3H except the organic layer 170. Thus, the same reference numerals will be used to refer to the same or like parts as those shown in FIGS. 3A through 3H and any further explanation concerning the above elements will be omitted. Referring to FIG. 5A, the first and second semiconductor patterns 122a and 122b, and the source pattern including the source electrode SE, the drain electrode DE and the (n+1)-th data line DLn+1 are formed on the base substrate 110. The first insulation layer 140 and the gate pattern including the gate electrode GE are formed on the base substrate 110 having the first ad second semiconductor patterns 122a and 122b and the source pattern formed thereon. The second insulation layer 160 is formed on the base substrate having the gate pattern formed thereon. The organic layer 170 is formed on the base substrate 110 having the second insulation layer 160 formed thereon. According to an exemplary embodiment, the organic layer 170 includes a photosensitive organic material.

Referring to FIG. 5B, portions of the organic layer 170, the second insulation layer 160 and the first insulation layer 140, which are over the drain electrode DE, are etched to form the contact hole CNT exposing a portion of the drain electrode DE. According to an exemplary embodiment, the organic layer 170 is patterned using a conventional photolithography method, and the second and first insulation layers 160 and 140 are dry etched using the patterned organic layer 170 as a mask.

Then, a transparent conductive layer TE is formed on the base substrate 110 having the contact hole CNT. The transparent conductive layer TE is electrically connected to the drain electrode through the contact hole CNT. When the transparent conductive layer TE is patterned through a conventional photolithography process, the first, second and third pixel electrodes PE1, PE2 and PE3 are formed.

Although not shown in FIGS. 4, 5A and 5B, according to another exemplary embodiment, the second insulation layer 160 may be omitted, and the organic layer 170 may make contact with the gate electrode GE, the gate lines GLm and GLm+1, and the first insulation layer 140 of the first, second and third pixel portions P1, P2 and P3.

Figure 6:
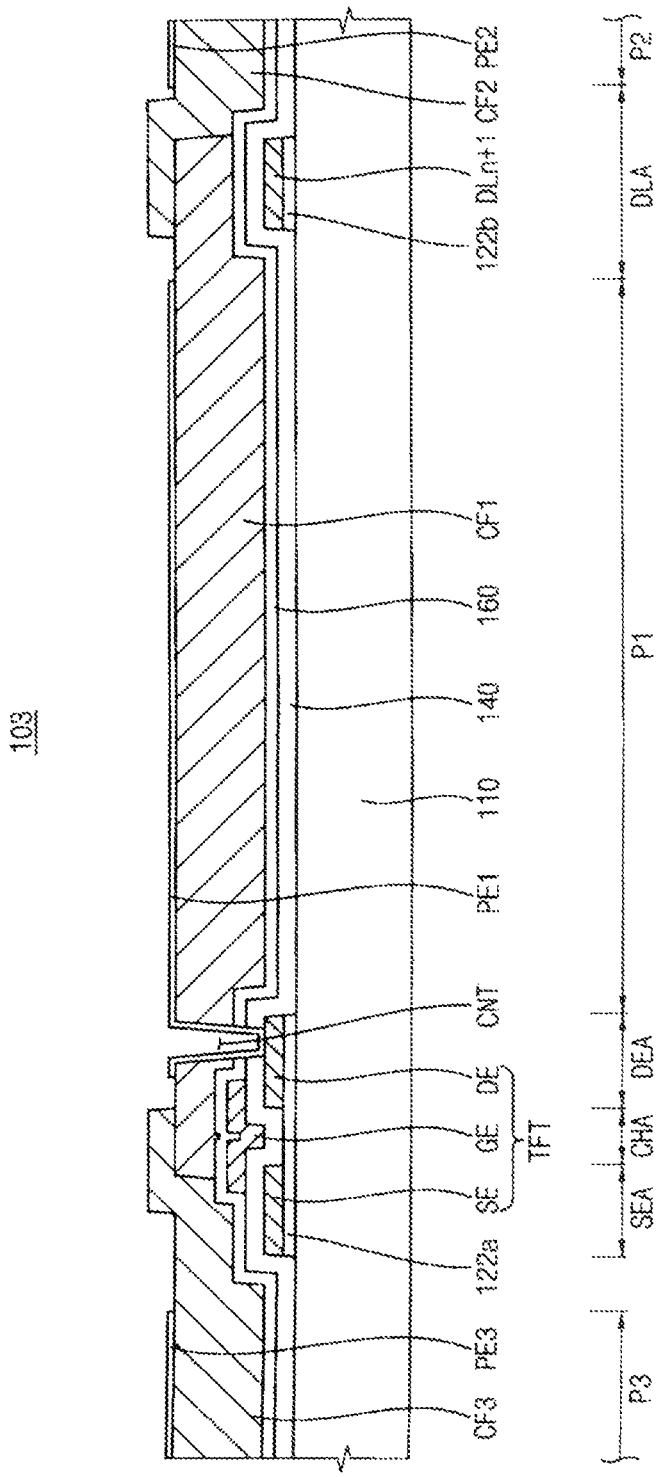
FIG. 6 is a cross-sectional view illustrating another exemplary embodiment of an array substrate according to the present invention, which is taken along the line I-I' in FIG. 1.

FIG. 6 is a cross-sectional view illustrating another exemplary embodiment of an array substrate according to the present invention, which is taken along the line I-I' in FIG. 1.

Referring to FIG. 6, the array substrate 103 of the current exemplary embodiment is same as the exemplary embodiment shown in FIG. 2 except first, second and third color filters CF1, CF2 and CF3. Thus, the same reference numerals will be used to refer to the same or like parts as those described in FIG. 2 and any further explanation concerning the above elements will be omitted.

The first, second and third color filters CF1, CF2 and CF3 are formed on the second insulation layer 160. The first, second and third color filters CF1, CF2 and CF3 cover the base substrate 110 having the thin-film transistor TFT formed thereon. According to an exemplary embodiment, the first, second and third color filters CF1, CF2 and CF3 are relatively thicker than other layers, thereby planarizing a surface of the array substrate 103.

The first, second and third color filters CF1, CF2 and CF3 are formed in the first, second and third pixel portions P1, P2 and P3, respectively. That is, the first color filter CF1 is formed in the first pixel portion P1, the second color filter CF2 is formed in the second pixel portion P2, and the third color filter CF3 is formed in the third pixel portion P3. According to an exemplary embodiment, the first color filter CF1 corresponds to a red color filter, the second color filter CF2 corresponds to a green color filter, and the third color filter CF3 corresponds to a blue color filter.

According to an exemplary embodiment, the first, second and third color filters CF1, CF2 and CF3 having different colors from each other may overlap over the thin-film transistor TFT and the (n+1)-th data line DLn+1. For example, the first and second color filters CF1 and CF2 may be sequentially formed over the thin-film transistor TFT. The first and third color filters CF1 and CF3 may be sequentially formed over the (n+1)-th data line DLn+1. The structure of the first, second and third color filters CF1, CF2 and CF3 may be changed according to a sequence of forming the first, second and third color filters CF1, CF2 and CF3.

Alternatively, according to another exemplary embodiment, a light blocking pattern (not shown) may be formed on the second insulation layer 160 corresponding to the data line region DLA and the thin-film transistor TFT. The light blocking pattern may be formed on the second insulation layer 160 corresponding to the gate lines GLm and GLm+1. The light blocking pattern may be formed at a boarder between two of the first, second and third pixels P1, P2 and P3 to define the first, second and third pixels P1, P2 and P3. The light blocking pattern blocks light advancing toward the thin-film transistor TFT.

The first, second and third pixel electrodes PE1, PE2 and PE3 are formed on the first, second and third color filters CF1, CF2 and CF3, respectively. That is, the first pixel electrode PE1 is formed on the first color filter CF1 of the first pixel P1, and electrically connected to the thin-film transistor TFT of the first pixel P1. The second pixel electrode PE2 is formed on the second color filter CF2 of the second pixel P2, and the third pixel electrode PE3 is formed on the third color filter CF3 of the third pixel P3.

Figure 7B:
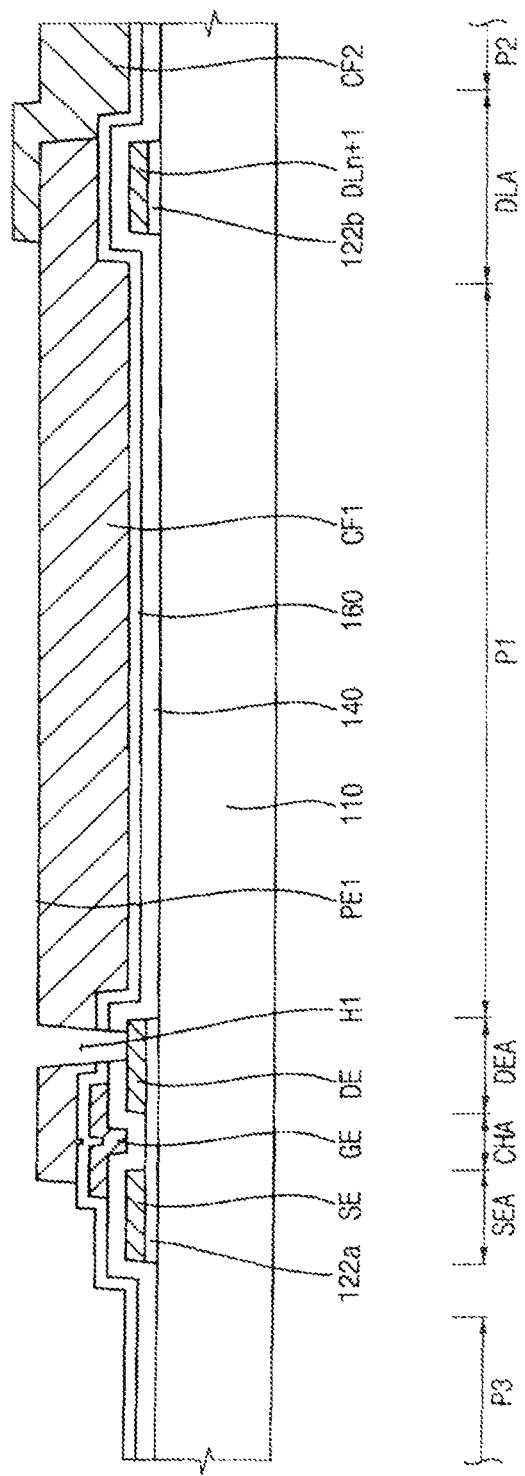

FIGS. 7A through 7C are cross-sectional views illustrating a method of manufacturing the array substrate in FIG. 6.

The method of manufacturing the array substrate, in FIG. 7A is substantially the same as the method in FIGS. 3A through 3H except for a first hole 162 of the second insulation layer 160, a second hole 142 of the first insulation layer 140 and a first color photo layer CPR1. Thus, the same reference numerals will be used to refer to the same or like parts as those shown in FIGS. 3A through 3H and any further explanation concerning the above elements will be omitted.

Referring to FIG. 7A, the first hole 162 and the second hole 142 are formed through the second insulation layer 160 and the first insulation layer 140, respectively through a photolithography method. Therefore, a portion of the drain electrode DE is exposed through the first and second holes 162 and 142.

The first color photo layer CPR1 is formed on the base substrate 110 having the second insulation layer 160 which includes the first hole 162. Then, the first color photo layer CPR1 is patterned to form the first color filter CF1 in the first pixel portion P1.

According to an exemplary embodiment, the first color photo layer CPR1 includes a negative type photoresist material including a first color pigment. According to an exemplary embodiment, the first color may be red. Further, the first color photo layer CPR1 may be formed on the base substrate 110 having the second insulation layer 160 through a spin coating method or a slit coating method.

Then, according to an exemplary embodiment, a third mask MASK3 is disposed over the base substrate 110 having the first color photo layer CPR1 formed thereon, and light is irradiated onto the first color photo layer CPR1. Then, the first color photo layer CPR1 is patterned using a developing solution. The third mask MASK3 includes an opening portion 32 corresponding to the first pixel portion P1, and light blocking portion 34 corresponding to the second and third pixel portions P2 and P3, the data line region DLA and a portion of the drain electrode DE. The third mask MASK3 is disposed such that the light blocking portion 34 corresponding to the end portion of the drain electrode DE corresponds to the first and second holes 162 and 142.

Referring to FIG. 7B, a first portion of the first color photo layer CRP1, which corresponds to the opening portion 32, is cured to remain, and a second portion of the first color photo layer CRP1, which corresponds to the light blocking portion 34 is removed by a developing solution. As a result, the first color filter CF1 is formed in the first pixel portion P1.

According to an exemplary embodiment, the first color filter CF1 includes a third hole H1 corresponding to the first and second holes 162 and 142. Therefore, the portion of the drain electrode DE1 is exposed through the third hole H1 of the first color filter CF1, the first hole 162 of the second insulation layer 160 and the second hole 142 of the first insulation layer 140.

Alternatively, according to another exemplary embodiment, the first hole 162 of the second insulation layer 160 and the second hole 142 of the first insulation layer 140 may be formed through the third mask MASK3. Particularly, when the second insulation layer 160 and the first color photo layer CRP1 are sequentially formed on the base substrate having the gate electrode GE formed thereon, the first color photo layer CRP1 is exposed and developed to form the first color filter CF1 having the third hole H1. Then, the second insulation layer 160 and the first insulation layer 140 are etched using the first color filter CF1 as a mask to expose the portion of the drain electrode DE.

Then, a second color photo layer (not shown) is formed on the base substrate 110 having the first color filter CF1 formed thereon through, for example, a spin coating method or a slit coating method. Then, a third mask MASK3 is disposed over the base substrate 110 having the second color photo layer formed thereon, and light is irradiated onto the second color photo layer. Then, the second color photo layer is patterned using a developing solution to form the second color filter CF2. The second color filter CF2 is formed in the second pixel portion P2. The first and second color filters CF1 and CF2 are sequentially stacked on the data line region DLA.

Referring to FIG. 7C, the third color filter CF3 is formed in the third pixel portion P3 of the base substrate 110 having the first and second color filters CF1 and CF2 formed thereon.

Alternatively, according to another exemplary embodiment, the first, second and third color filters CF1, CF2 and CF3 may be formed through an inkjet printing method. For example, a first color ink is jetted onto the first pixel portion P1 of the base substrate 110 to form the first color filter CF1, a second color ink is jetted onto the second pixel portion P2 of the base substrate 110 to form the second color filter CF2, and a third color ink is jetted onto the third pixel portion P3 of the base substrate 110 to form the third color filter CF3. For example, the first, second and third color inks include an organic material including first, second and third color pigments, respectively.

Then, a transparent conductive layer TE is formed on the base substrate 110 having the first, second and third color filters CF1, CF2 and CF3 formed thereon. The transparent conductive layer TE may be formed on the base substrate 110 through, for example, a sputtering method. The transparent conductive layer TE is electrically connected to the drain electrode DE exposed through the third hole H1 of the first color filter CF1, the first hole 162 of the second insulation layer 160 and the second hole 142 of the first insulation layer 140. The transparent conductive layer TE is patterned through a conventional photolithography method to form the first, second and third pixel electrodes PE1, PE2 and PE3.

Figure 8:
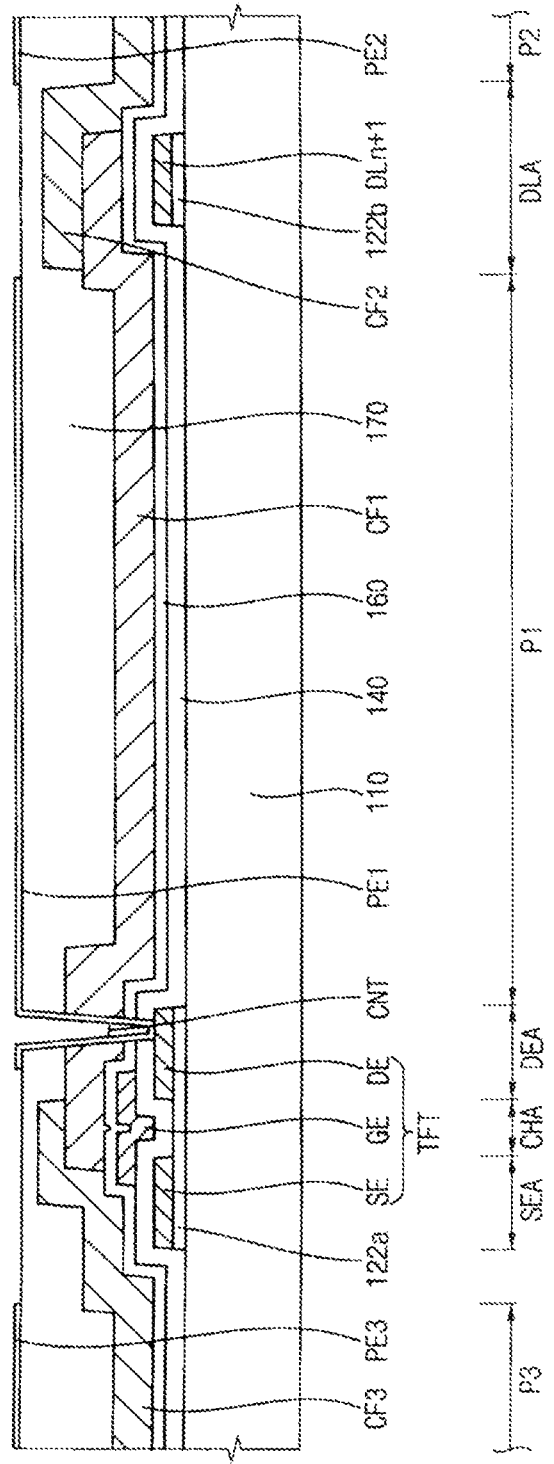
FIG. 8 is a cross-sectional view illustrating another exemplary embodiment of an array substrate according to the present invention, which is taken along the line I-I' in FIG. 1.

FIG. 8 is a cross-sectional view illustrating another exemplary embodiment of an array substrate according to the present invention, which is taken along the line I-I' in FIG. 1.

Referring to FIGS. 1 and 8, the array substrate 104 of the present embodiment is the same as that shown in FIG. 2 except first, second and third color filters CF1, CF2 and CF3 and the organic layer 170. Thus, the same reference numerals will be used to refer to the same or like parts as those described in FIG. 2 and any further explanation concerning the above elements will be omitted.

The first, second and third color filters CF1, CF2 and CF3 are formed on the second insulation layer 160. The first, second and third color filters CF1, CF2 and CF3 cover the base substrate 110 having the thin-film transistor TFT formed thereon. The first color filter CF1 is formed in the first pixel portion P1, the second color filter CF2 is formed in the second pixel portion P2, and the third color filter CF3 is formed in the third pixel portion P3. The first, second and third color filters CF1, CF2 and CF3 having different colors from each other may overlap over the thin-film transistor TFT and the (n+1)-th data line DLn+1. According to an exemplary embodiment, the first and second color filters CF1 and CF2 may be sequentially formed over the thin-film transistor TFT. The first and third color filters CF1 and CF3 may be sequentially formed over the (n+1)-th data line DLn+1. The structure of the first, second and third color filters CF1, CF2 and CF3 may be changed according to a sequence of forming the first, second and third color filters CF1, CF2 and CF3.

The organic layer 170 is formed on the base substrate 110 having the first, second and third color filters CF1, CF2 and CF3 formed thereon. The organic layer 170 may have a relatively thicker thickness than other layers to planarize a surface of the array substrate 104.

According to an exemplary embodiment, first, second and third pixel electrodes PE1, PE2 and PE3 are formed on the organic layer 170. Specifically, the first, second and third pixel electrodes PE1, PE2 and PE3 are formed on the organic layer 170 in the first, second and third pixel portions P1, P2 and P3, respectively. That is, the first pixel electrode PE1 is formed in the first pixel portion P1, the second pixel electrode PE2 is formed in the second pixel portion P2, and the third pixel electrode PE3 is formed in the third pixel portion P3. The first pixel electrode PE1 is electrically connected to the thin-film transistor TFT of the first pixel portion P1 through a contact hole CNT. The contact hole CNT is formed by removing a portion of the first insulation layer 140, the second insulation layer 160, the first color filter CF1 and the organic layer 170, the contact hole CNT being disposed over the drain electrode DE.

FIGS. 9A and 9B are cross-sectional views illustrating an exemplary embodiment of a method of manufacturing the array substrate in FIG. 8, according to the present invention.

The method of manufacturing the array substrate, in FIG. 9A is substantially the same as the method in FIGS. 7A and 7B except the organic layer 170. Thus, the same reference numerals will be used to refer to the same or like parts as those shown in FIGS. 7A and 7B and any further explanation concerning the above elements will be omitted.

Referring to FIG. 9A, first and second semiconductor patterns 122a and 122b and the source pattern including a source electrode SE, a drain electrode DE and an (n+1)-th data line DLn+1 are formed on the base substrate 110. A first insulation layer 140 and a gate pattern including a gate electrode GE are formed on the base substrate 110 having the first and second semiconductor patterns 122a and 122b and the source pattern formed thereon. A second insulation layer 160 is formed on the base substrate 110 having the gate pattern formed thereon. First, second and third color filters CF1, CF2 and CF3 are formed on the second insulation layer 160, and the organic layer 170 is formed on the base substrate 110 having the first, second and third color filters CF1, CF2 and CF3 formed thereon.

Referring to FIG. 9B, a portion of the organic layer 170, which is disposed over the drain electrode DE, is removed to form a contact hole CNT. A transparent conductive layer TE is formed on the base substrate 110 having the organic layer 170 with contact hole CNT. The transparent conductive layer TE is electrically connected to the drain electrode DE through the contact hole CNT. The transparent conductive layer TE is patterned to form the first, second and third pixel electrodes PE1, PE2 and PE3.

FIG. 10 is a cross-sectional view illustrating another exemplary embodiment of an array substrate according to the present invention, which is taken along the line I-I' in FIG. 1.

Referring to FIGS. 1 and 10, the array substrate 105 of this current exemplary embodiment is the same as that shown in FIG. 6 except a light blocking pattern BM and a capping layer 180. Thus, the same reference numerals will be used to refer to the same or like parts as those shown in FIG. 6 and any further explanation concerning the above elements will be omitted.

The light blocking pattern BM is formed on the second insulation layer 160 corresponding to the data lines DLn and DLn+1, the gate lines GLm and GLm+1, and the thin-film transistor TFT. The light blocking pattern BM includes, for example, an organic material.

The first, second and third color filters CF1, CF2 and CF3 are formed on the base substrate 110 having the second insulation layer 160 formed thereon. The first color filter CF1 is formed in the first pixel portion P1, the second color filter CF2 is formed in the second pixel portion P2, and the third color filter CF3 is formed in the third pixel portion P3, respectively. According to an exemplary embodiment, the first, second and third color filters CF1, CF2 and CF3 may have relatively thicker thickness than other layers to planarize a surface of the array substrate 105.

The capping layer 180 is formed on the base substrate 110 having the light blocking pattern BM and the first, second and third color filters CF1, CF2 and CF3 formed thereon. The capping layer 180 covers the light blocking pattern BM and the first, second and third color filters CF1, CF2 and CF3. The capping layer 180 prevents impurities and gas released from the blocking pattern BM and the first, second and third color filters CF1, CF2 and CF3 from deteriorating the first, second and third pixel electrodes PE1, PE2 and PE3.

FIGS. 11A through 11C are cross-sectional views illustrating an exemplary embodiment of a method of manufacturing the array substrate in FIG. 10, according to the present invention.

The method of manufacturing the array substrate, in FIG. 11A is substantially the same as the method in FIGS. 3A and 3B except the first hole 162 of the second insulation layer 160, the second hole 142 of the first insulation layer 140 and the light blocking pattern BM. Thus, the same reference numerals will be used to refer to the same or like parts as those shown in FIGS. 3A and 3B and any further explanation concerning the above elements will be omitted.

The first and second semiconductor patterns 122a and 122b, and the source pattern including the source electrode SE, the drain electrode DE and the (n+1)-th data line DLn+1 are formed on the base substrate 110. The first insulation layer 140 and the gate pattern including the gate electrode GE are formed on the base substrate 110 having the first and second semiconductor patterns 122a and 122b, and the source pattern formed thereon.

The second insulation layer 160 is formed on the base substrate 110 having the gate pattern formed thereon. The first and second holes 162 and 142 are formed through the second and first insulation layers 160 and 140, respectively. Then, a portion of the drain electrode DE is exposed through the first and second holes 162 and 142.

When the first and second holes 162 and 142 are formed, the light blocking pattern BM is formed on the base substrate 110. The light blocking pattern BM is formed second insulation layer 160 over the gate electrode GE and in the data line region DLA.

According to an exemplary embodiment, an organic material is spread on the base substrate 110 having the second insulation layer 160 formed thereon to form a black matrix layer (not shown), and the black matrix layer is patterned through a photolithography method to form the light blocking pattern BM. Alternatively, a metal layer (not shown) is formed on the base substrate 110 having the second insulation layer 160 formed thereon through a sputtering method, and the metal layer may be patterned to form the light blocking pattern BM. Alternatively, according to another exemplary embodiment, the light blocking pattern BM may be formed through an inkjet printing method.

Referring to FIG. 11B, the first color filter CF1 is formed in the first pixel portion P1 of the base substrate 110 having the light blocking pattern BM formed thereon. The first color filter CF1 includes the third hole H1 corresponding to the first and second holes 162 and 142. The first color filter CF1 may be formed through patterning a first color photo layer (not shown) formed on the base substrate 110 having the light blocking pattern BM formed thereon by using a photolithography process. The third hole H1 of the first color filter CF1 may be formed through the photolithography process.

The second color filter CF2 is formed in the second pixel portion P2 of the base substrate 110 having the first color filter CF1 formed thereon, and the third color filter CF3 is formed in the third pixel portion P3 of the base substrate 110 having the first and second color filters CF1 and CF2 formed thereon. For example, the second and third color filters CF2 and CF3 may be formed by patterning a color photo layer through a photolithography method.

Alternatively, according to another exemplary embodiment, the first, second and third color filters CF1, CF2 and CF3 may be formed through an inkjet printing method.

Although not shown in FIG. 11B, according to an exemplary embodiment, the light blocking pattern BM may be omitted, and the first, second and third color filters CF1, CF2 and CF3 having different colors may overlap with each other on the second insulation layer 160 over the gate electrode GE and in the data line region DLA. For example, the first and third color filters CF1 and CF3 may overlap with each other on the second insulation layer 160 over the gate electrode GE.

The capping layer 180 is formed on the base substrate 110 having the light blocking pattern BM and the first, second and third color filters CF1, CF2 and CF3 formed thereon. According to an exemplary embodiment, the capping layer 180 includes silicon nitride ("SiNx", 0<x<1), silicon oxide ("SiOx", 0<x<1) or silicon nitride oxide ("SiOxN(1-x)", 0<x<1).

Referring to FIG. 11C, a portion of the capping layer 180, which is over the portion of the drain electrode DE, is etched to form a fourth hole H2. The fourth hole H2 corresponds to the third hole H1 of the first color filter CF1. Then, the drain electrode DE is exposed through the fourth, third, second and first holes H2, H1, 142 and 162.

A transparent conductive layer (not shown) is formed on the base substrate 110 having the capping layer 180 with the fourth hole H2. The transparent conductive layer is patterned through a photolithography method to form the first, second and third pixel electrodes PE1, PE2 and PE3. The first pixel electrode PE1 is formed in the first pixel portion P1 of the base substrate 110, and electrically connected to the drain electrode DE.

Figure 12:
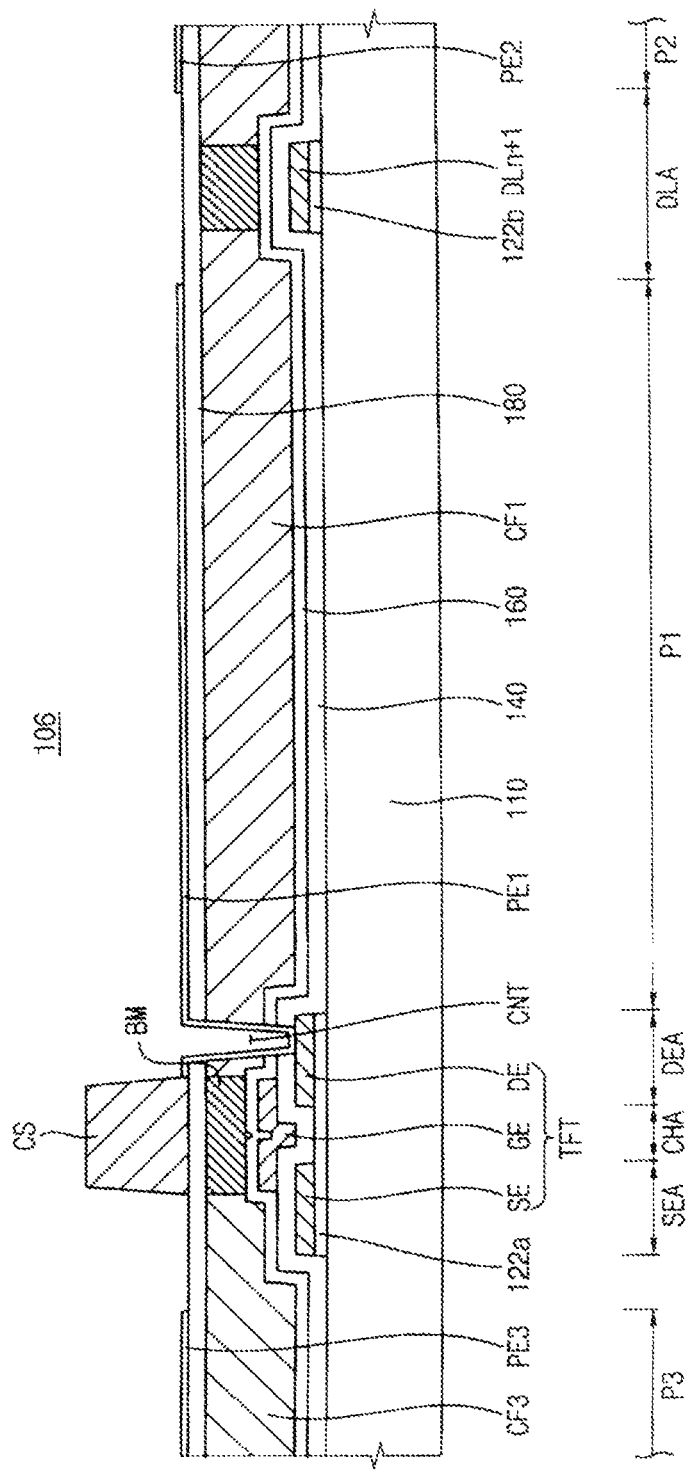
FIG. 12 is a cross-sectional view illustrating another exemplary embodiment of an array substrate according to the present invention, which is taken along the line I-I' in FIG. 1.

FIG. 12 is a cross-sectional view illustrating another exemplary embodiment of an array substrate according to the present invention, which is taken along the line I-I' in FIG. 1.

Referring to FIG. 12, the array substrate 106 of this current exemplary embodiment is the same as that shown in FIG. 10 except for a column spacer CS. Thus, the same reference numerals will be used to refer to the same or like parts as those shown in FIG. 10 and any further explanation concerning the above elements will be omitted.

The column spacer CS may be formed on the capping layer 180 over the thin-film transistor TFT. For example, the column spacer CS may be formed on the light blocking pattern BM over the gate electrode GE.

Figure 13:
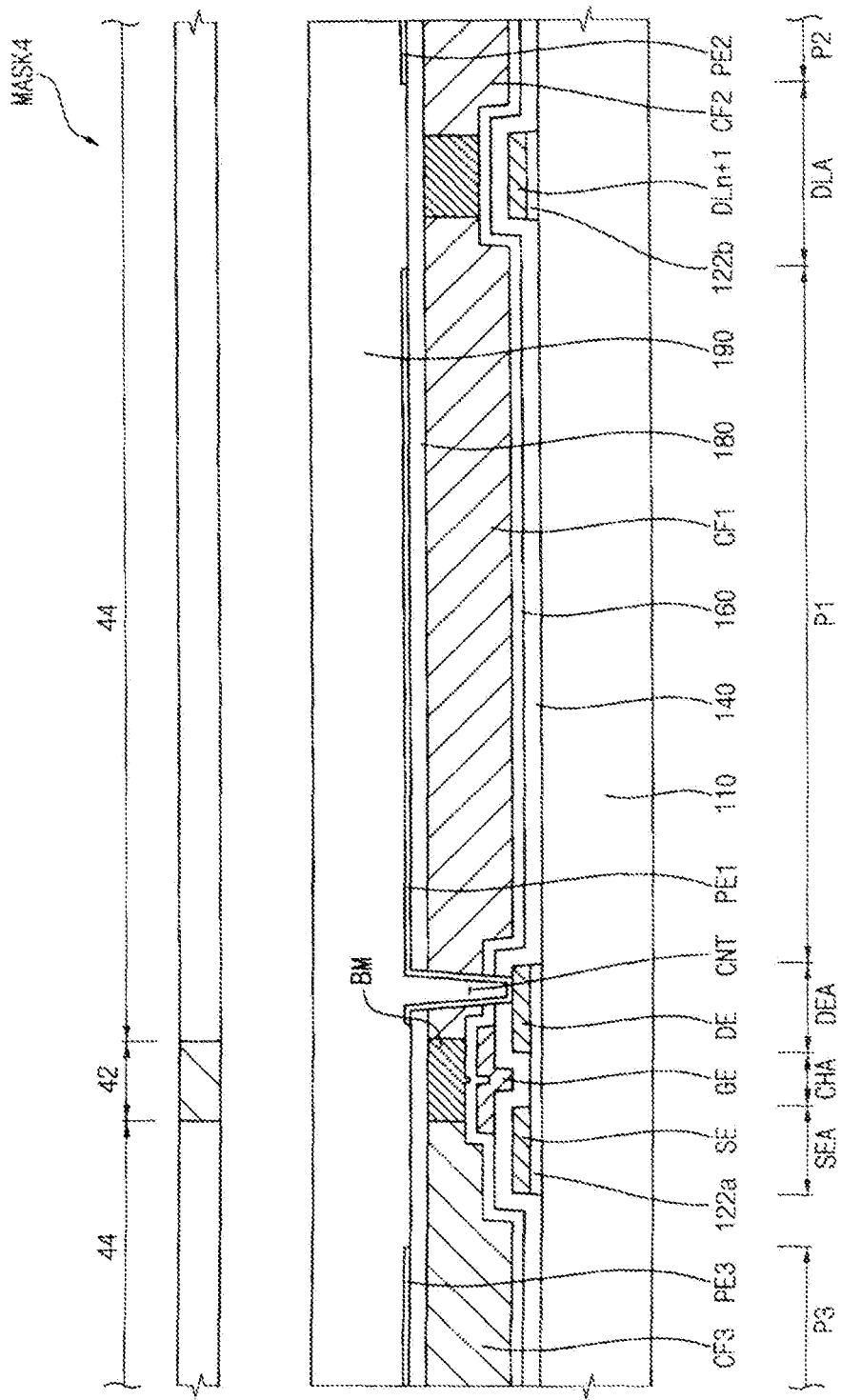
FIG. 13 is a cross-sectional view illustrating an exemplary embodiment of a method of manufacturing the array substrate in FIG. 12.

FIG. 13 is a cross-sectional view illustrating an exemplary embodiment of a method of manufacturing the array substrate in FIG. 12.

The method of manufacturing the array substrate, in FIG. 13 is substantially the same as the method in FIGS. 11A and 11C except for a photo layer 190. Thus, the same reference numerals will be used to refer to the same or like parts as those shown in FIGS. 11A and 11C and any further explanation concerning the above elements will be omitted.

Referring to FIG. 13, the photo layer 190 is formed on the base substrate 110 having the first, second and third pixel electrodes PE1, PE2 and PE3 formed thereon. According to an exemplary embodiment, the photo layer 190 includes a photosensitive organic material.

When a fourth mask MASK4 is disposed over the base substrate 110 having the photo layer 190 formed thereon, the photo layer 190 is exposed and developed to be patterned, so that the column spacer CS is formed. The column spacer CS maintains a cell gap between the array substrate and the opposite substrate spaced apart from the array substrate. The fourth mask MASK4 includes a light blocking portion 42 and an opening portion 44. The fourth mask MASK4 may be disposed such that the light blocking portion 42 corresponds to the light blocking pattern BM over the gate electrode GE.

FIG. 14 is a cross-sectional view illustrating another exemplary embodiment of an array substrate according to the present invention, which is taken along the line I-I' in FIG. 1.

Referring to FIG. 14, an array substrate 107 according to the present embodiment includes a base substrate 110, a first color filter, CF1, a second color filter CF2, a third color filter CF3, a light blocking pattern BM, an overcoating layer OC, a first semiconductor pattern 122a a second semiconductor pattern 122b, a source electrode SE, a drain electrode DE, data lines DLn and DLn+1, a first insulation layer 140, a gate electrode GE, gate lines GLm and GLm+1, a second insulation layer 160, and pixel electrodes PE1, PE2 and PE3.

According to an exemplary embodiment, the first, second and third color filters CF1, CF2 and CF3 are formed on the base substrate 110 such that the first, second and third color filters CF1, CF2 and CF3 make contact with the base substrate 110. The first, second and third color filters CF1, CF2 and CF3 are formed in the first, second and third pixel portions P1, P2 and P3 of the base substrate 110, respectively. That is, the first color filter CF1 is formed in the first pixel portion P1, the second color filter CF2 is formed in the second pixel portion P2, and the third color filter CF3 is formed in the third pixel portion P3, respectively.

According to an exemplary embodiment, the light blocking pattern BM may be formed in a boarder region of the first, second and third pixel portions P1, P2 and P3, the source region SEA, the drain region DEA and the channel region CHA. The boarder region of the first, second and third pixel portions P1, P2 and P3 may be, for example, a gate line region (not shown) and the data line region DLA.

The overcoating layer OC is formed on the base substrate 110 having the first, second and third color filters CF1, CF2 and CF3 and the light blocking pattern BM formed thereon. The overcoating layer OC covers the first, second and third color filters CF1, CF2 and CF3 and the light blocking pattern BM, and reduces height difference between the first, second and third color filters CF1, CF2 and CF3 and the light blocking pattern BM.

The first semiconductor pattern 122a is formed on the overcoating layer OC of the source region SEA, the channel region CHA and the drain region DEA. The second semiconductor pattern 122b is formed on the overcoating layer OC of the data line region DLA of the base substrate 110. According to an exemplary embodiment, the second semiconductor pattern 122b may be optional.

The source electrode SE is formed on the first semiconductor pattern 122a of the source region SEA such that the source electrode SE is electrically connected to the n-th data line DLn. The drain electrode DE is spaced apart from the source electrode SE by the channel region CHA to be disposed over the first semiconductor pattern 122a in the drain region DEA. The (n+1)-th data line DLn+1 is disposed substantially in parallel with the n-th data line DLn in the data line region DLA. The (n+1)-th data line DLn+1 is disposed on the second semiconductor pattern 122b in the data line region DLA.

The first insulation layer 140 covers the source electrode SE, the drain electrode DE and the data lines DLn and DLn+1, and makes contact with the overcoating layer OC of the first, second and third pixel portions P1, P2 and P3. The first insulation layer 140 includes a first hole 142 of the contact hole CNT exposing a portion of the drain electrode DE.

The gate electrode GE and the gate lines GLm and GLm+1 are formed on the first insulation layer 140. The gate electrode GE is electrically connected to the m-th gate line GLm. The gate electrode GE is disposed in the channel region CHA. The gate electrode GE may be extended from the channel region CHA to a portion of the source region SEA and the drain region DEA to be overlapped with the source electrode SE and the drain electrode DE, respectively.

The second insulation layer 160 covers the gate electrode GE and the gate lines GLm and GLm+1, and makes contact with the first insulation layer 140 of the pixel portions P1, P2 and P3. The second insulation layer 160 includes a second hole 162 of the contact hole CNT, which corresponds to the first hole 142 of the first insulation layer 140 in order to expose the portion of the drain electrode DE. Although not shown in FIG. 14, an organic layer (not shown) may be formed on the second insulation layer 160. Alternatively, according to an exemplary embodiment, the second insulation layer 160 may be omitted, and the organic layer may make contact with the gate electrode GE and the gate lines GLm and GLm+1.

The pixel electrodes PE1, PE2 and PE3 are formed on the second insulation layer 160. The first pixel electrode PE1 is formed in the first pixel portion P1, and electrically connected to the thin-film transistor TFT of the first pixel portion P1. The second pixel electrode PE2 is formed in the second pixel portion P2, and the third pixel electrode PE3 is formed in the third pixel portion P3.

Figure 15A:
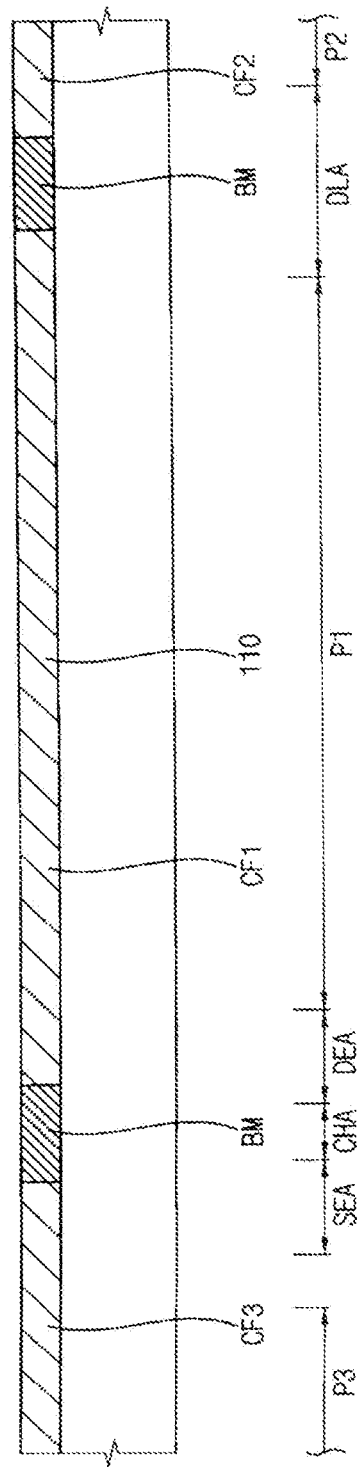
FIGS. 15A through 15C are cross-sectional views illustrating an exemplary embodiment of a method of manufacturing the array substrate in FIG. 14, according to the present invention.
Figure 15B:
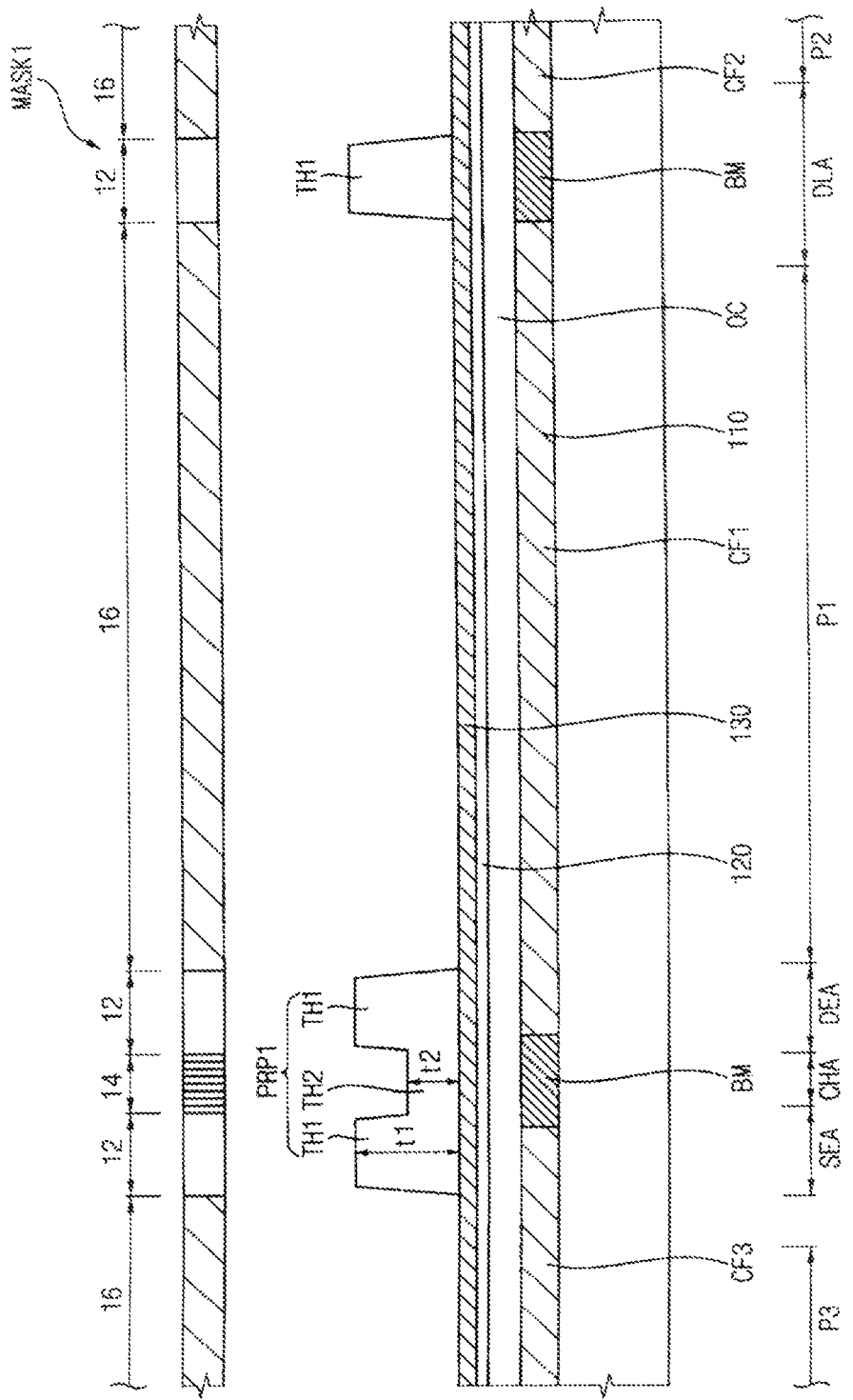
Figure 15C:
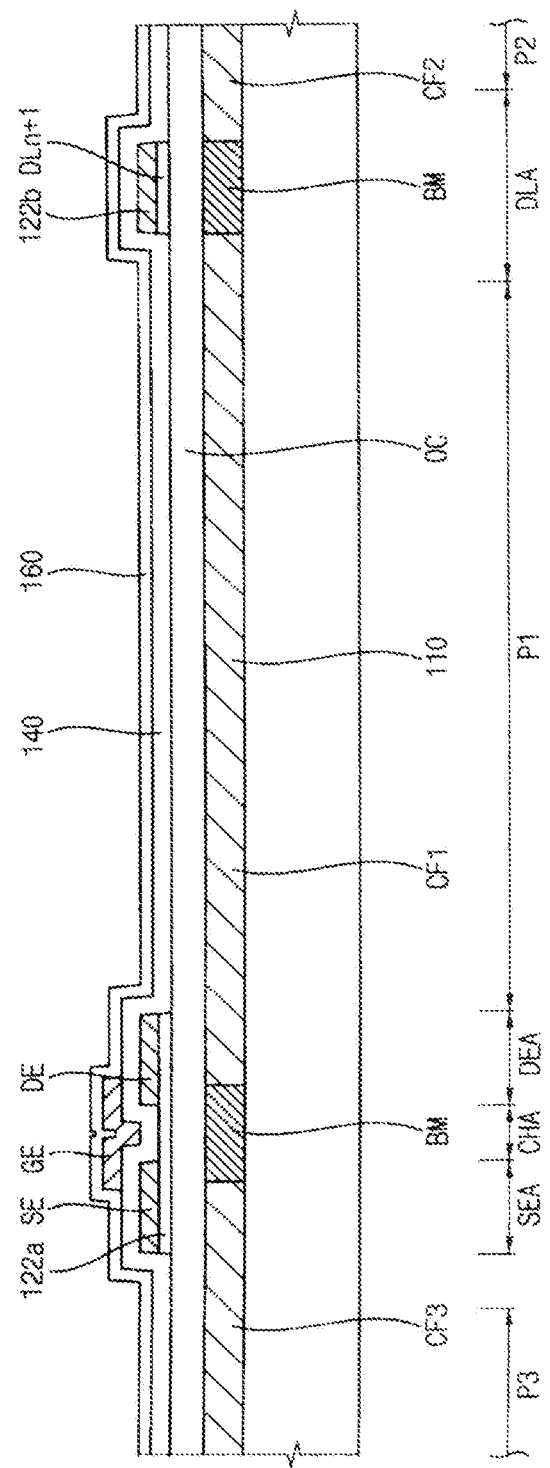

FIGS. 15A through 15C are cross-sectional views illustrating an exemplary embodiment of a method of manufacturing the array substrate in FIG. 14.

Referring to FIG. 15A, the light blocking pattern BM and the first, second and third color filters CF1, CF2 and CF3 are formed on the base substrate 110.

The light blocking pattern BM may be extended from the channel region CHA toward the source region SEA and the drain region DEA. The light blocking pattern BM may be also formed in the data line region DLA. The light blocking pattern BM may include metal or an organic material.

Then, the first, second and third color filters CF1, CF2 and CF3 are formed on the base substrate 110 having the light blocking pattern BM formed thereon.

A first color photo layer (not shown) is formed on the base substrate 110 having the light blocking pattern BM formed thereon, and then the first color photo layer is patterned through, for example, a photolithography operation to form the first color filter CF1 in the first pixel portion P1 of the base substrate 110. A second color photo layer (not shown) is formed on the base substrate 110 having the first color filter CF1 formed thereon, and then the second color photo layer is patterned through, for example, a photolithography operation to form the second color filter CF2 in the second pixel portion P2 of the base substrate 110.

Alternatively, according to an exemplary embodiment, the first, second and third color filters CF1, CF2 and CF3 may be formed through an inkjet printing method using first, second and third color inks, respectively.

Referring to FIG. 15B, the overcoating layer OC, the oxide semiconductor layer 120 and a source metal layer 130 are formed on the base substrate 110 having the light blocking pattern BM and the first, second and third color filters CF1, CF2 and CF3 formed thereon.

The overcoating layer OC planarizes a surface of the base substrate 110 having the light blocking pattern BM and the first, second and third color filters CF1, CF2 and CF3 formed thereon. The oxide semiconductor layer 120 may be formed on the overcoating layer OC through, for example, a sputtering method. The source metal layer 130 is formed on the base substrate 110 having the oxide semiconductor layer 120.

A first photoresist film (not shown) is formed on the base substrate 110 having the source metal layer 130 formed thereon, and then the first photoresist film is patterned using a first mask MASK1 to form a first photoresist pattern PRP1. The first photoresist pattern PRP1 includes a first thickness portion TH1 and a second thickness portion TH2. The first thickness portion TH1 is disposed on the source metal layer 130 of the source region SEA, the drain region DEA and the data line region DLA. The second thickness portion TH2 is disposed on the source metal layer 130 of the channel region CHA.

Referring to FIG. 15C, the source metal layer 130 is patterned using the first photoresist pattern PRP1 as a mask to form the source pattern including the source electrode SE, the drain electrode DE and the data line DLn+1, and the oxide semiconductor layer 120 is patterned to form the first and second semiconductor patterns 122a and 122b.

The first insulation layer 140 is formed on the base substrate 110 having the source pattern including the source electrode SE, the drain electrode DE and the data line DLn+1 formed thereon.

A gate metal layer (not shown) is formed on the base substrate 110 having the first insulation layer 140 formed thereon, and then the gate metal layer is patterned to form the gate pattern including the gate electrode GE and the gate line (not shown).

Further, the second insulation layer 160 is formed on the base substrate 110 having the gate pattern formed thereon.

FIG. 16 is a cross-sectional view illustrating another exemplary embodiment of an array substrate according to the present invention, which is taken along the line I-I' in FIG. 1.

Referring to FIG. 16, the array substrate 108 is the same as that shown in FIG. 14 except the organic layer 170. Thus, the same reference numerals will be used to refer to the same or like parts as those shown in FIG. 14 and any further explanation concerning the above elements will be omitted.

The organic layer 170 is formed on the second insulation layer 160. The first, second and third pixel electrodes PE1, PE2 and PE3 are formed on the organic layer 170 of the first, second and third pixel portions P1, P2 and P3, respectively. The first pixel electrode PE1 is electrically connected to the drain electrode DE through the contact hole CNT formed through the first insulation layer 140, the second insulation layer 160 and the organic layer 170.

Figure 17:
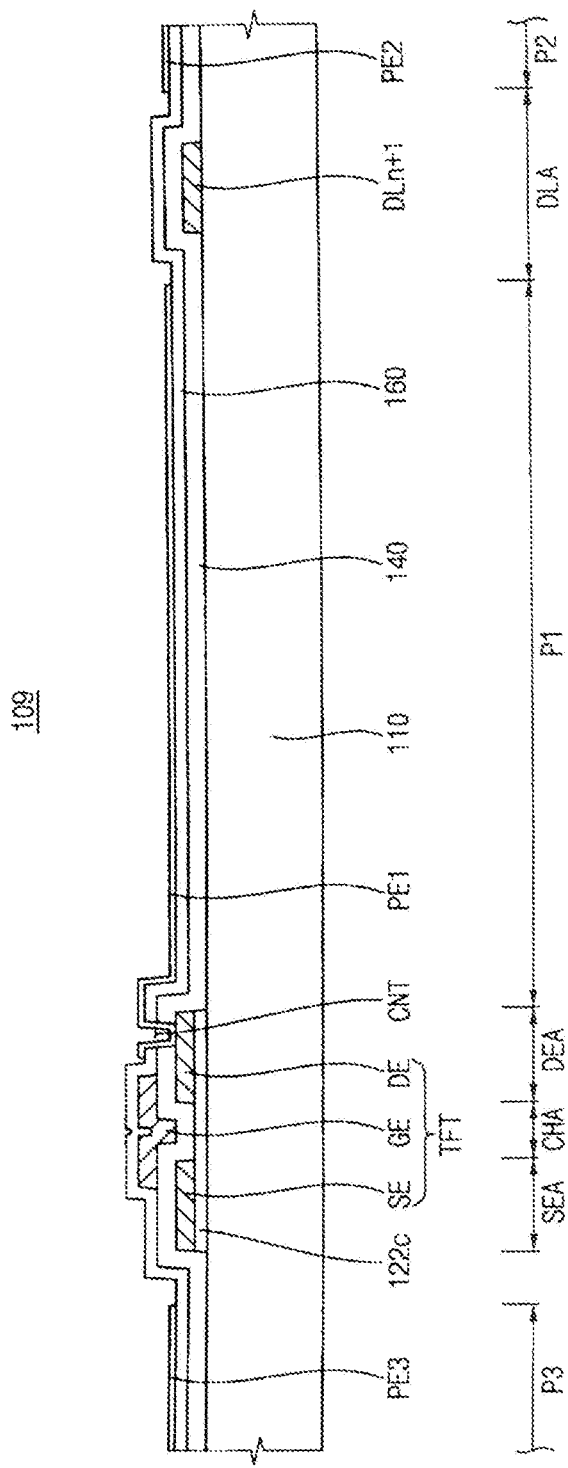
FIG. 17 is a cross-sectional view illustrating another exemplary embodiment of a method of manufacturing the array substrate according to the present invention.

FIG. 17 is a cross-sectional view illustrating another exemplary embodiment of a method of manufacturing the array substrate according to the present invention.

Referring to FIG. 17, an array substrate 109 includes a semiconductor pattern 122c, a source electrode SE, a drain electrode DE, an (n+1)-th data line, a first insulation layer 140, a gate electrode GE, a second insulation layer 160, a first pixel electrode PE1, a second pixel electrode PE2, and a third pixel electrode PE3.

The semiconductor pattern 122c is disposed in a source region SEA, a channel region CHA and a drain region DEA of the base substrate 110. The semiconductor pattern 122c includes metal oxide.

The source electrode SE is disposed on the semiconductor pattern 122c of the source region SEA. The drain electrode DE is disposed on the semiconductor pattern 122c of the drain region DEA such that the drain electrode DE is spaced apart from the source electrode SE. The (n+1)-th data line DLn+1 is formed on the base substrate 110 of the data line region DLA such that the (n+1)-th data line DLn+1 makes contact with the base substrate 110.

The first insulation layer 140 is disposed on the source electrode SE, the drain electrode DE and the (n+1)-th data line DLn+1. The first insulation layer 140 is also disposed on the first, second and third pixel portions P1, P2 and P3. The first insulation layer 140 includes a first hole 142 of the contact hole CNT exposing a portion of the drain electrode DE.

The gate electrode GE is disposed on the first insulation layer 140 on the source electrode SE and the drain electrode DE such that the gate electrode GE is overlapped with portions of the source electrode SE and the drain electrode DE.

The second insulation layer 160 is disposed on the gate electrode GE and the first insulation layer 140 of the data line region DLA and the first, second and third pixel portions P1, P2 and P3. The second insulation layer 160 includes a second hole 162 of the contact hole CNT, which corresponds to the first hole 142 of the first insulation layer 140 to expose the portion of the drain electrode DE.

The first, second and third pixel electrodes PE1, PE2 and PE3 are disposed on the second insulation layer 160 of the first, second and third pixel portions P1, P2 and P3, respectively. The first pixel electrode PE1 is electrically connected to the drain electrode DE of the first pixel portion P1 through the contact hole CNT.

FIGS. 18A and 18B are cross-sectional views illustrating an exemplary embodiment of a method of manufacturing the array substrate in FIG. 17.

Referring to FIG. 18A, the oxide semiconductor layer 120 is formed on the base substrate 110, and then a first photoresist pattern PRP1 is formed on the base substrate 110 having the oxide semiconductor layer 120 formed thereon.

Particularly, the first photoresist pattern PRP1 is formed through the following process. A first photoresist film (not shown) is formed on the base substrate 110 having the oxide semiconductor formed thereon. The first photoresist film may include a negative type photoresist material. A first mask MASK1 is disposed over the base substrate 110 having the first photoresist film formed thereon, and then light is irradiated onto the base substrate having the first photoresist film formed thereon through the first mask MASK1. A first portion of the first photoresist film, which is cured by the light passing through an opening portion 12 of the first mask MASK1, remains. A second portion of the first photoresist film, which corresponds to the light blocking portion 16 of the first mask MASK1, is removed by a developing solution. As a result, the photoresist pattern PRP1 is formed. The first photoresist pattern PRP1 is formed in the source region SEA, the drain region DEA and the channel region CHA of the base substrate 110.

According to an exemplary embodiment, the oxide semiconductor layer 120 may include zinc oxide, indium oxide, tin oxide, gallium oxide or aluminum oxide. The oxide semiconductor layer 120 may have a single oxide semiconductor such as zinc oxide, indium oxide, etc. Alternatively, according to another exemplary embodiment, the oxide semiconductor layer 120 may include mixed oxide semiconductor such as gallium indium zinc oxide ("$Ga_2O_3$—$In_2O_3$—ZnO"), indium gallium tin oxide ("$In_2O_3$—$Ga_2O_3$—SnO"), indium zinc oxide ("$In_2O_3$—$Zn_2O_3$"), zinc aluminum oxide ("$Zn_2O_3$—$Al_2O_3$"), etc. According to another exemplary embodiment, the oxide semiconductor layer 120 may further include metal oxide including beryllium (Be), magnesium (Mg), calcium (Ca), strontium (Sr), barium (Ba), radium (Ra), thallium (Tl), scandium (Sc), yttrium (Y), lanthanum (La), actinium (Ac), titanium (Ti), zirconium (Zr), hafnium (Hf) or rutherfordium (Rf), etc. These may be used alone or in a combination thereof.

Referring to FIGS. 17 and 18B, the oxide semiconductor layer 120 is patterned using the first photoresist pattern PRP1 as a mask to form the semiconductor pattern 122c. The semiconductor pattern 122c has a same outline as the first photoresist pattern PRP1. The semiconductor pattern 122c is formed in the source region SEA, the channel region CHA and the drain region DEA.

A source metal layer 130 is formed on the base substrate 110 having the semiconductor pattern 122c formed thereon. The source metal layer 130 may be formed through, for example, a sputtering method. The source metal layer 130 may have a single layered structure or a multi-layered structure having no less than two layers, each of which has different physical and chemical characteristics.

The source metal layer 130 may be patterned through a conventional photolithography method using a second mask MASK2. A second photoresist film (not shown) is formed on the base substrate 110 having the source metal layer 130 formed thereon, and then the second photoresist film is patterned using the second mask MASK2 to form a second photoresist pattern PRP2. The second photoresist pattern PRP2 is formed on the source metal layer 130 of the source region SEA, the drain region DEA and the data line region DLA. The second photoresist pattern PRP2 is not formed in the channel region CHA to expose the source metal layer 130 of the channel region CHA.

Then, the source metal layer 130 is patterned using the second photoresist pattern PRP2 to form the source pattern including the source electrode SE, the n-th data line (not shown) electrically connected to the source electrode SE, the drain electrode DE spaced apart from the source electrode SE and the (n+1)-th data line DLn+1.

The source metal layer 130 may be etched through a wet etching method using an etch solution with hydrogen peroxide ($H_2O_2$) based.

The first insulation layer 140 is formed on the base substrate 110 having the source patter including the source electrode SE, the drain electrode DE and the (n+1)-th data line DLn+1 formed thereon. A gate metal layer (not shown) is formed on the first insulation layer 140, and then the gate metal layer is patterned to form a gate pattern including the gate electrode GE and the gate lines (not shown). The second insulation layer 160 is formed on the base substrate 110 having the gate pattern formed thereon. The second and first insulation layers 160 and 140 are patterned to form the contact hole CNT exposing a portion of the drain electrode DE. Further, a transparent conductive layer TE is formed on the base substrate 110 having the second insulation layer 160 formed thereon, and the transparent conductive layer TE is patterned to form the first, second and third pixel electrodes PE1, PE2 and PE3.

The following Table 1 shows characteristics of a first thin-film transistor having a channel layer of amorphous silicon (a-Si) semiconductor pattern, and a second thin-film transistor having a channel layer including metal oxide semiconductor pattern. The metal oxide is gallium indium zinc oxide ("$Ga_2O_3$—$In_2O_3$—ZnO"). A channel width of the first and second thin-film transistors is about 50 μm, and a channel length of the first and second thin-film transistors is about 4 μm.

TABLE 1

| | First Thin-Film Transistor | Second Thin-Film Transistor |
|---|---|---|
| Semiconductor Pattern Phase | Amorphous | Amorphous |
| Mobility ($cm^2/V \cdot S$) | 0.5 | 3~10 |
| Sub-threshold swing (V/dec) | No more than 0.94 V/dec | No more than 0.85 V/dec |
| Ratio of On-current to Off-current | $10^6$ | $10^8$ |
| Off-current | No more than 1 pA | No more than 1 pA |
| Hysteresis | ○ | X |
| Light Sensibility | Unstable | Stable |

Referring to Table 1, the a-Si semiconductor pattern of the first thin-film transistor is in an amorphous state, and the oxide semiconductor pattern of the second thin-film transistor is also in an amorphous state. The a-Si semiconductor pattern includes a mobility of about 0.5 $cm^2/V \cdot S$, and the oxide semiconductor pattern includes a mobility of about 3 $cm^2/V \cdot S$ to about 10 $cm^2/V \cdot S$ which is greater than that of the a-Si semiconductor pattern. The sub-threshold swing of the a-Si semiconductor pattern is no more than about 0.94V/dec, and the sub-threshold swing of the oxide semiconductor pattern is no more than about 0.85V/dec. The ratio of on-current to off-current of the a-Si semiconductor pattern is about $10^6$, and the ratio of on-current to off-current of the semiconductor pattern is about $10^8$. Especially, the a-Si semiconductor pattern includes hysteresis characteristic, but the oxide semiconductor pattern does not include hysteresis characteristic.

Figure 19A:
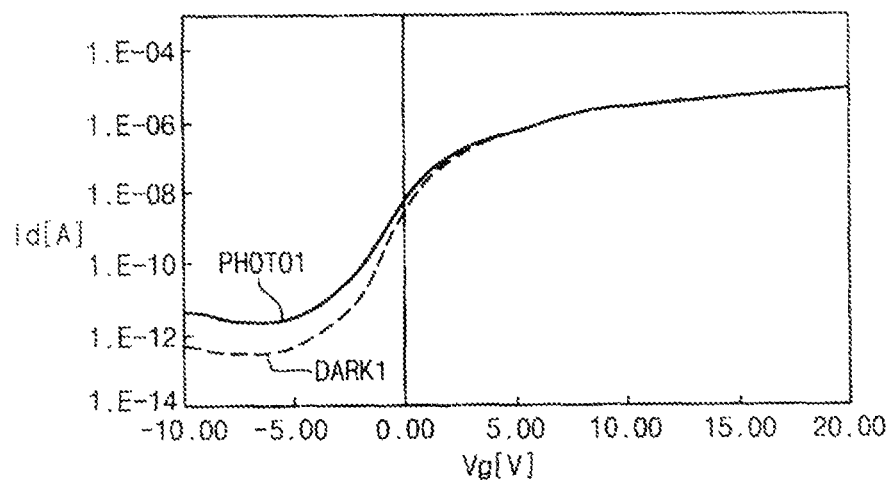
FIGS. 19A and 19B are graphs showing current-voltage characteristics of a thin-film transistor.
Figure 19B:
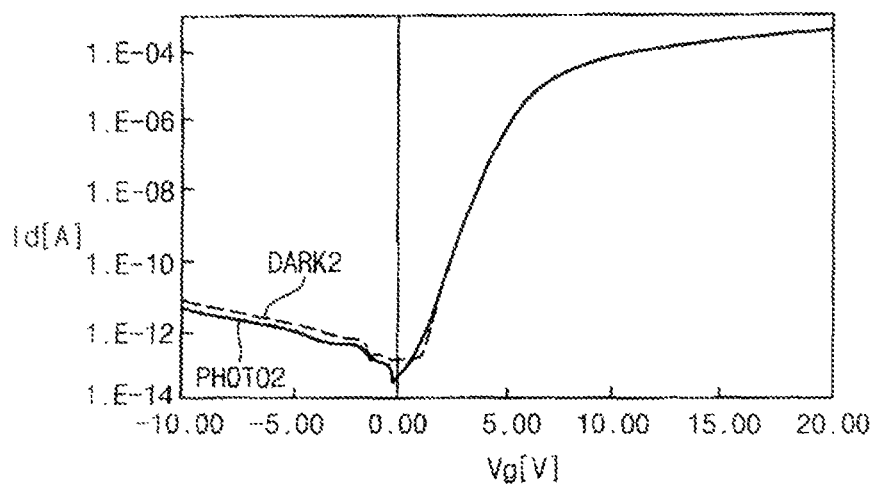

FIGS. 19A and 19B are graphs showing current-voltage characteristics of a thin-film transistor.

Referring to FIG. 19A, a gap between a first Vg-Id curve PHOTO1 corresponding to a case in which light is irradiated onto the first thin-film transistor of Table 1, and a second Vg-Id curve DARK1 corresponding to a case in which light is not irradiated onto the first thin-film transistor of Table 1, is great. Thus, when light arrives at the first thin-film transistor, the off-current Ioff, which corresponds to Id when Vg is about −7V, increases by about one order, compared with the case when the first thin-film transistor is blocked from light.

Referring to FIG. 19B, a third Vg-Id curve PHOTO2 corresponding to a case in which light is irradiated onto the second thin-film transistor of Table 1, and a fourth Vg-Id curve DARK2 corresponding to a case in which light is not irradiated onto the second thin-film transistor of Table 1, almost coincide. Thus, the leakage current of the second thin-film transistor is minimized.

According to the thin-film transistor, the array substrate having the thin-film transistor and the method of manufacturing the array substrate, the semiconductor pattern includes metal oxide pattern. Therefore, leakage current induced by light is minimized. As a result, characteristics of the thin-film transistor are enhanced, after-image is reduced to enhance display quality, and stability of manufacturing process is enhanced.

While the present invention has been shown and described with reference to some exemplary embodiments thereof, it should be understood by those of ordinary skill in the art that various changes in form and details may be made therein without departing from the spirit and scope of the present invention as defined by appended claims.

What is claimed is:

1. A method of manufacturing an array substrate, comprising:
    providing a base substrate including a active region, a pixel region and wiring region;
    forming an oxide semiconductor layer and a source metal layer on the base substrate, wherein the oxide semiconductor layer being disposed under the source metal layer;
    patterning the source metal layer to form a source remaining pattern in the active region and a data line in the wiring region;
    patterning the oxide semiconductor layer to form a first oxide semiconductor pattern in the active region and a second oxide semiconductor pattern in the wiring region;
    patterning the source remaining pattern in the active portion to form a source electrode and a drain electrode such that the source electrode and the drain electrode are spaced apart from each other, the source electrode and the drain electrode substantially define an outline of the first oxide semiconductor pattern, and the data line substantially defines an outline of the second oxide semiconductor pattern;
    forming a first insulation layer and a gate metal layer on the base substrate on which the source electrode, the drain electrode and the data line are disposed;
    patterning the gate metal layer on the first insulation layer to form a gate pattern comprising a gate electrode in the active region and a gate line in the wiring region, the gate electrode being disposed on the first insulation layer, the gate line being electrically connected to the gate electrode and extended in a direction crossing the data line;
    forming a second insulation layer on the base substrate on which the gate pattern is formed;
    forming a contact hole extending from the second insulation layer to expose a portion of drain electrode;
    forming a conductive layer on the second insulation layer and the portion of the drain electrode; and
    patterning the conductive layer to form a pixel electrode in the pixel portion such that the pixel electrode is electrically connected to the drain electrode through the contact hole.

2. The method of claim 1, further comprising:
    forming a photoresist pattern on the base substrate on which the source metal layer is formed, the photoresist pattern comprising:
        a first thickness portion formed in a source region corresponding to the source electrode and a drain region corresponding to the drain electrode, and
        a second thickness portion formed in a channel region corresponding to the gate electrode,
    wherein the first thickness portion is thicker than the second thickness portion.

3. The method of claim 2, wherein the patterning the source metal layer to form a source remaining pattern in the active region comprises etching a region of the source metal layer on which the photoresist pattern is not disposed, and
    wherein the patterning the oxide semiconductor layer to form the first oxide semiconductor pattern in the active region and a second oxide semiconductor pattern in the wiring region comprises etching a region of the oxide semiconductor layer on which the photoresist pattern is not disposed.

4. The method of claim 3, wherein the patterning the source remaining pattern in the active portion to form the source electrode and the drain electrode comprises:
    removing the second thickness portion of the photoresist pattern in the channel region; and
    etching the source remaining pattern of the channel region on which the second thickness portion of the photoresist pattern is removed while the first oxide semiconductor pattern of the channel region substantially remains.

5. The method of claim 4, wherein the etching the region of the source metal layer on which the photoresist pattern is not disposed comprises etching the region of the source metal layer through a first etching solution, and
    wherein the etching the region of the oxide semiconductor layer on which the photoresist pattern is not disposed comprises etching the region of the oxide semiconductor layer through a second etching solution.

6. The method of claim 5, wherein the source metal layer comprises copper (Cu).

7. The method of claim 6, wherein the first etching solution comprises hydrogen peroxide ($H_2O_2$).

8. The method of claim 7, wherein the second etching solution comprises nitric acid ($HNO_3$), sulfuric acid ($H_2SO_4$), hydrochloric acid (HCl) and acetic acid ($CH_3COOH$).

9. The method of claim 7, wherein the second etching solution further comprises hydrofluoric acid (HF-d($H_2O$), 0<d<1).

* * * * *